United States Patent
Kim

(10) Patent No.: US 7,969,396 B2
(45) Date of Patent: Jun. 28, 2011

(54) LIQUID CRYSTAL DISPLAY

(75) Inventor: Dong-Gyu Kim, Yongin-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 12/878,623

(22) Filed: Sep. 9, 2010

(65) Prior Publication Data

US 2011/0006974 A1 Jan. 13, 2011

Related U.S. Application Data

(63) Continuation of application No. 11/403,121, filed on Apr. 12, 2006, now Pat. No. 7,796,104.

(30) Foreign Application Priority Data

Apr. 13, 2005 (KR) .................... 10-2005-0030678

(51) Int. Cl.
*G09G 3/36* (2006.01)
(52) U.S. Cl. ................ 345/87; 345/92; 345/99; 257/59; 349/41
(58) Field of Classification Search ............ 345/87–100, 345/204; 257/59; 349/38–43, 54, 73, 74, 349/141–147, 187
See application file for complete search history.

(56) References Cited

U.S. PATENT DOCUMENTS

| | | | |
|---|---|---|---|
| 6,621,476 | B2 | 9/2003 | Walton et al. |
| 7,256,861 | B2 | 8/2007 | Park et al. |
| 2003/0076451 | A1 | 4/2003 | Hector et al. |
| 2004/0135147 | A1 | 7/2004 | Kim et al. |
| 2004/0263747 | A1 | 12/2004 | Chae |
| 2005/0179631 | A1 | 8/2005 | Lyu |
| 2005/0237291 | A1 | 10/2005 | Aoki |
| 2006/0152641 | A1 | 7/2006 | Brody |

FOREIGN PATENT DOCUMENTS

| | | |
|---|---|---|
| CN | 1573486 | 2/2005 |
| CN | 1601362 | 3/2005 |
| JP | 2004038165 | 2/2004 |
| JP | 2005055896 | 3/2005 |

*Primary Examiner* — Kimnhung Nguyen
(74) *Attorney, Agent, or Firm* — F. Chau & Associates, LLC

(57) ABSTRACT

A liquid crystal display includes an array of pixels. Each pixel is divided into a first sub-pixel and a second sub-pixel, and different data voltages are separately applied to (or evolved at) the two sub-pixels, thereby enhancing the lateral side visibility. Each sub-pixel includes a sub-pixel electrode (connected to the drain electrode of a sub-pixel's switching element) overlapped with the sub-pixel's storage electrode. A first predetermined voltage is applied to the first sub-pixel and second predetermined voltage is applied the second sub-pixel, and thus the first sub-pixel electrode may receive a voltage lower than the voltage of the second sub-pixel electrode. The first sub-pixel electrode may be larger in area than the second sub-pixel electrode. The overlapping area between the first drain electrode and the storage electrode of a first sub-pixel may be larger than the overlapping area between the drain electrode and the storage electrode of a second sub-pixel. Thus the kickback voltage of the first sub-pixel may be substantially the same as the kickback voltage of the second sub-pixel.

9 Claims, 15 Drawing Sheets

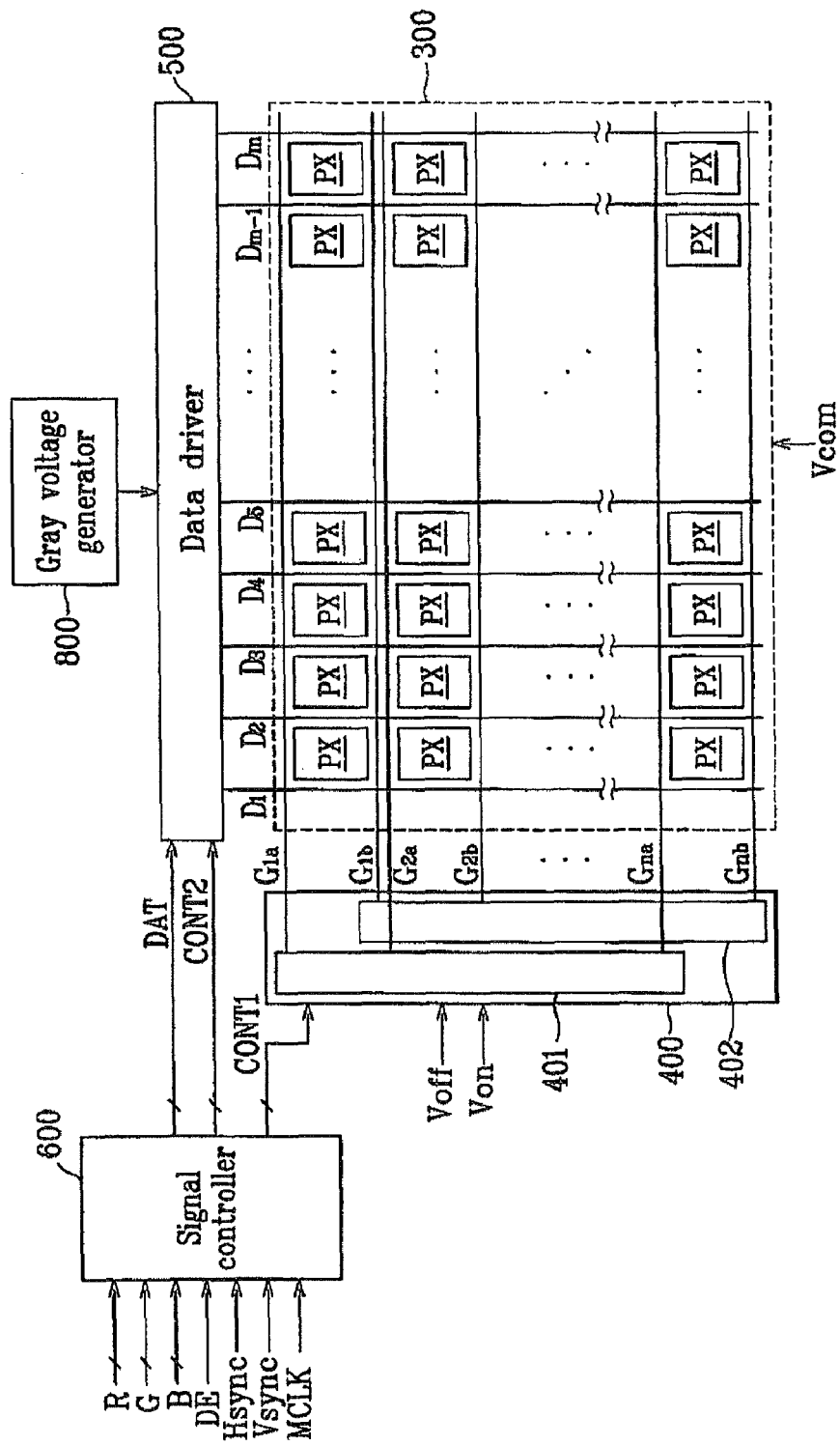

LIQUID CRYSTAL DISPLAY

RELATED APPLICATION

This application is a Continuation Application of U.S. patent application Ser. No. 11/403,121, filed Apr. 12, 2006, now U.S. Pat. No. 7,796,104 which claims priority under 35 U.S.C. §119 of Korean Patent Application No. 10-2005-0030678 filed on Apr. 13, 2005, the contents of which are incorporated by reference herein in their entirety.

BACKGROUND OF THE INVENTION (1) Field of the Invention

The present invention relates to a liquid crystal display.

(2) Description of the Related Art

A liquid crystal display ("LCD"), one of the most extensively used flat panel display devices, typically includes two substrates having field-generating electrodes (such as pixel and common electrodes) mounted thereon, and a liquid crystal layer sandwiched between the substrates. The LCD generates an electric field in the liquid crystal layer by applying voltages to the field-generating electrodes, and aligns the liquid crystal molecules of the liquid crystal layer to control the polarization of light incident thereto (e.g., from a "backlight"), thereby displaying the desired images.

In a vertically aligned ("VA") mode LCD, the directions of liquid crystal molecules are aligned vertical to the upper and lower panels (substrates) while no electric field is applied, and gives a high contrast ratio and a wide reference viewing angle. The reference viewing angle refers to a viewing angle with a contrast ratio of 1:10, or an inter-gray luminance inversion limit angle.

In the VA mode LCD, cutouts or protrusions may be formed at the field-generating electrodes to realize a wide viewing angle. As the direction of the liquid crystal molecules to be inclined is determined by the cutouts or protrusions, the inclination directions of the liquid crystal molecules can be diversified, thereby widening the reference viewing angle.

However, the VA mode LCD provides poor visibility at the lateral sides thereof, as compared to the visibility at the front side thereof. For example, in a patterned vertically aligned (PVA) mode LCD having cutouts, the luminance thereof is heightened as it comes to the lateral side thereof, and in a serious case, the luminance difference between the high grays is eliminated so that the display image may appear to be distorted.

In order to enhance the lateral side visibility, it has been proposed that a pixel controlled by one data (e.g., one color pixel) should be divided into two sub-pixels, which are capacitor-combined with each other. A voltage is directly applied to one of the sub-pixels, and a voltage drop is caused at the other sub-pixel due to the capacitor combination. In this way, the two sub-pixels are differentiated in voltage from each other and have different light transmittances.

However, with such a method, the transmittances of the two sub-pixels cannot be directly and correctly controlled to the desired level, and in particular, the light transmittance is differentiated for the respective color. The voltages cannot be differently adjusted with respect to the respective colors. Furthermore, the aperture ratio is deteriorated due to the addition of a conductor for a capacitor combination, and the light transmittance is reduced due to the capacitor combination-induced voltage drop.

SUMMARY OF THE INVENTION

A liquid crystal display includes an array of pixels. Each pixel is divided into a first sub-pixel and a second sub-pixel, and different data voltages may be separately applied to the two sub-pixels, thereby enhancing the lateral side visibility. Each sub-pixel includes a sub-pixel electrode (connected to the drain electrode of a sub-pixel's switching element) overlapped with the sub-pixel's storage electrode. The first sub-pixel electrode may be larger in area than the second sub-pixel electrode. A first predetermined voltage may be applied to the first sub-pixel and second predetermined voltage may be applied the second sub-pixel, and thus the first sub-pixel electrode may receive a voltage lower than the voltage of the second sub-pixel electrode. The overlapping area between the first drain electrode and the storage electrode of a first sub-pixel may be larger than the overlapping area between the drain electrode and the storage electrode of a second sub-pixel. Thus the kickback voltage of the first sub-pixel may be substantially the same as the kickback voltage of the second sub-pixel.

Embodiments of the present invention provide a liquid crystal display having enhanced lateral side visibility with reasonable light transmittance and aperture ratio.

According to one aspect of the present invention, a liquid crystal display includes a plurality (array) of pixel each pixel including: first and second sub-pixels. Each sub-pixel includes a switch (e.g., a thin film transistor (TFT) having drain, gate and source electrodes), a sub-pixel electrode (of an LC capacitor), and a storage electrode (of a storage capacitor). The drain electrodes overlap the storage electrodes. A predetermined voltage is applied to the second sub-pixel electrode, and the first sub-pixel electrode receives a voltage lower than the voltage of the second sub-pixel electrode. The first and second storage electrodes are electrically separated from each other. The overlapping area between the first drain electrode and the storage electrode is larger than the overlapping area between the second drain electrode and the storage electrode.

The data voltages applied to the first and second sub-pixel electrodes of each pixel may be different (in magnitude or timing) from each other, and they may be derived from one image information signal.

In some embodiments, first and second gate lines transmit (different) gate signals to the first and second gate electrodes, respectively, and data transmits (the same) data voltages to the first and second source electrodes.

The timing of the gate signals (voltages) applied to the first and second gate lines may be different from each other.

In other embodiments, a gate line transmits (the same) gate signals to first and second gate electrodes, while first and second data lines transmit (different) data voltages to the first and second source electrodes, respectively.

In other embodiments, a gate line transmits (the same) gate signals to first and second gate electrodes, and a data line transmits (the same) data voltages to first and second source electrodes.

The channel width to channel length ratio of the first thin film transistor (TFT) of the first sub-pixel may be different (e.g., greater) from the channel width to channel length ratio of the second thin film transistor (TFT) of the second sub-pixel.

The first sub-pixel electrode may be larger in area than the second sub-pixel electrode.

According to another aspect of the present invention, a liquid crystal display includes a plurality (array) of pixels, each pixel including a first sub-pixel and a second sub-pixel. A plurality of first gate lines connect to the first sub-pixels. A plurality of first data lines cross (perpendicular to) the first gate lines, and are connected to the first sub-pixels. The second sub-pixel is connected to either one or both of (e.g., at least one of) the first gate line and the first data line. A predetermined voltage is applied to the first sub-pixel, and the voltage received by the second sub-pixel may be higher than the voltage received by the first sub-pixel. The kickback voltage of the first sub-pixel may substantially the same as the kickback voltage of the second sub-pixel.

In some embodiments, a plurality of second gate lines may be connected to the second sub-pixels, while the second sub-pixels are be connected to the first data lines. Thus, the first sub-pixel may include a first switching element connected to the first gate line and the first data line, a first liquid crystal capacitor connected to the first switching element, and a first storage capacitor connected to the first switching element. The second sub-pixel may include a second switching element connected to the second gate line and the first data line, a second liquid crystal capacitor connected to the second switching element having a capacitance smaller than the capacitance of the first liquid crystal capacitor, and a second storage capacitor connected to the second switching element having a capacitance smaller than the capacitance of the first storage capacitor.

In other embodiments, a plurality of second data lines may be connected to the second sub-pixels, while the second sub-pixels may be connected to the first gate lines. Thus, the first sub-pixel may include a first switching element connected to the first gate line and to the first data line, a first liquid crystal capacitor connected to the first switching element, and a first storage capacitor connected to the first switching element. The second sub-pixel may include a second switching element connected to the first gate line and to the second data line, a second liquid crystal capacitor connected to the second switching element having a capacitance smaller than the capacitance of the first liquid crystal capacitor, and a second storage capacitor connected to the second switching element having a capacitance smaller than the capacitance of the first storage capacitor.

According to another aspect of the present invention, a liquid crystal display includes a plurality (array) of pixels arranged in the form of a matrix, each pixel including a first sub-pixel and a second sub-pixel. A plurality of first gate lines connect to the first sub-pixels. A plurality of first data lines cross (are perpendicular to) the first gate lines, and are connected to the first sub-pixels. The first sub-pixel includes a first switching element connected to the first gate line and to the first data line, a first liquid crystal capacitor connected to the first switching element, and a first storage capacitor connected to the first switching element. The second sub-pixel includes a second switching element connected to either one or both (at least one) of the first gate line and the first data line, a second liquid crystal capacitor connected to the second switching element having a capacitance smaller than the capacitance of the first liquid crystal capacitor, and a second storage capacitor connected to the second switching element having a capacitance smaller than the capacitance of the first storage capacitor. A predetermined voltage is applied to the second sub-pixel, and the first sub-pixel may receive a voltage lower than the voltage received by the second sub-pixel.

A plurality of second gate lines may be connected to the second switching elements, while the second switching elements may be connected to the first data lines.

Alternatively, plurality of second data lines may be connected to the second switching elements, while the second switching elements may be connected to the first gate lines.

The present invention will be described more fully hereinafter with reference to the accompanying drawings, in which preferred embodiments of the invention are shown. The present invention may, however, be embodied in many different forms and should not be construed as limited to the exemplary embodiments set forth herein.

In the drawings, the thickness of layers, films, and regions are exaggerated for clarity. Like numerals refer to like elements throughout. It will be understood that when an element such as a layer, film, region, or substrate is referred to as being "on" another element, it can be directly on the other element or intervening elements may also be present. Now, LCDs according to embodiments of the present invention will be specifically explained with reference to the accompanying drawings.

BRIEF DESCRIPTION OF THE DRAWINGS

The present invention will become more apparent by describing embodiments thereof in detail with reference to the accompanying drawings, in which:

FIGS. 1A, 1B, and 1C are block diagrams of an LCD having pixels structured according to a first embodiment of the present invention;

DETAILED DESCRIPTION OF PREFERRED EMBODIMENTS

Figure 1A:
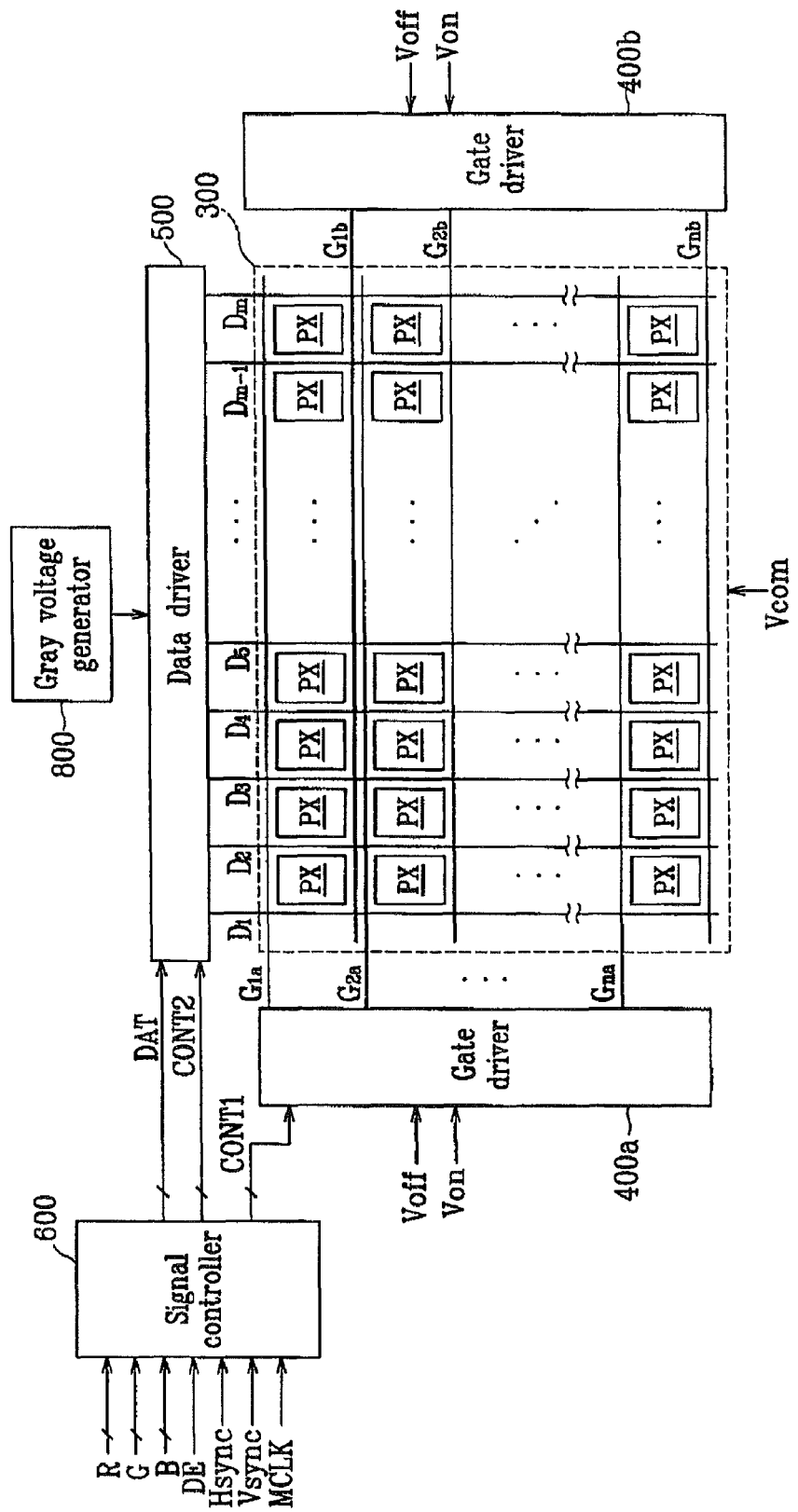
Figure 1B:
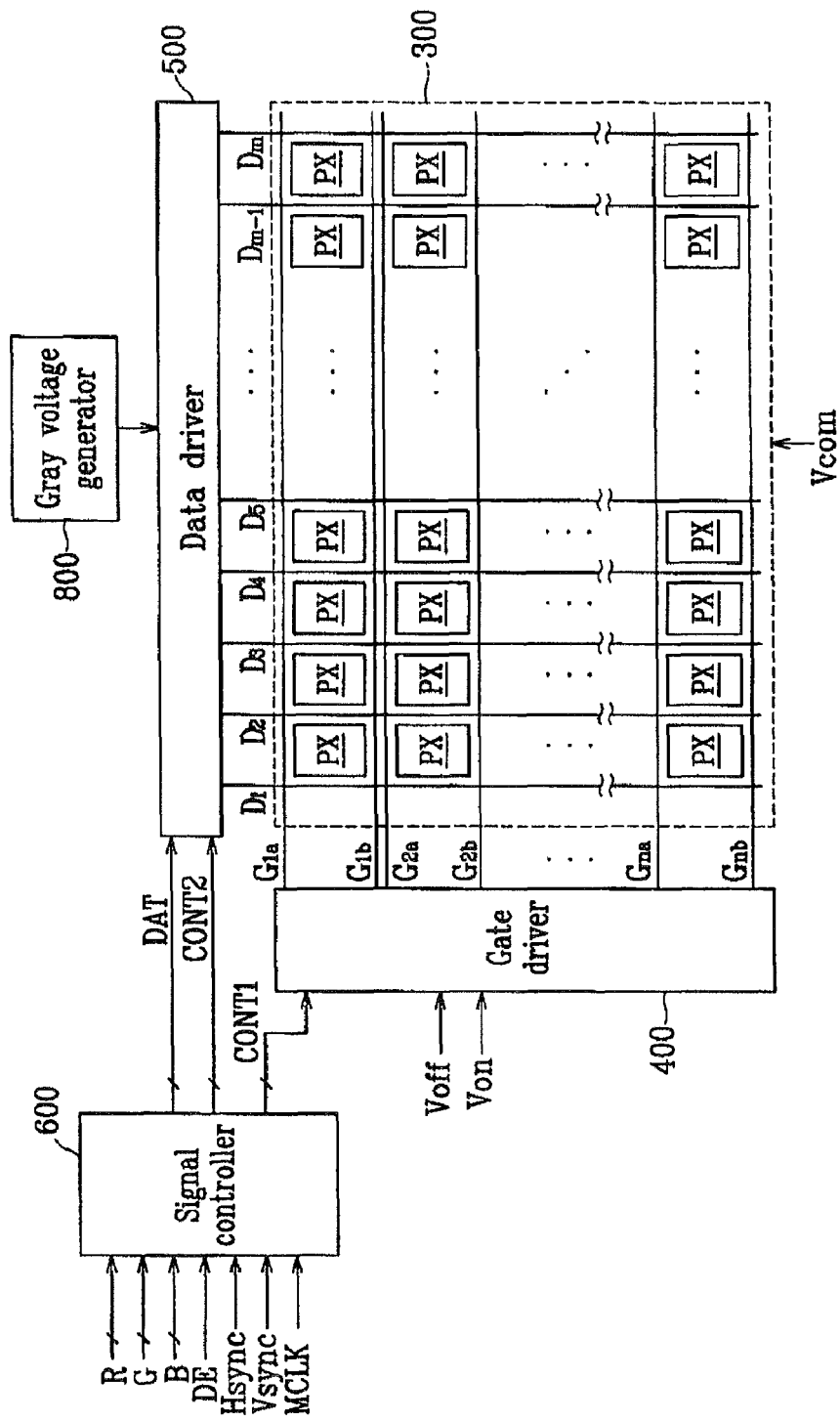
Figure 2:
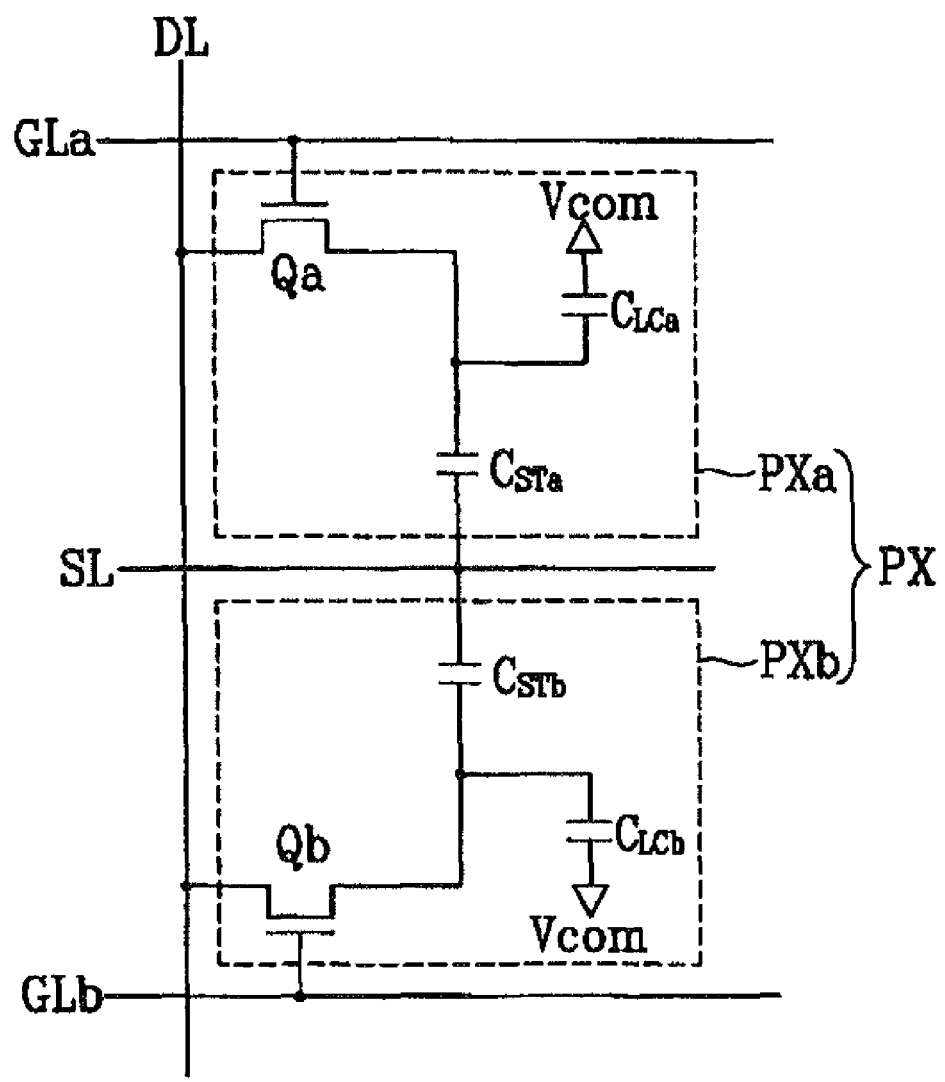
FIG. 2 is an equivalent circuit diagram of a pixel of an LCD according the first embodiment of the present invention.
Figure 3:
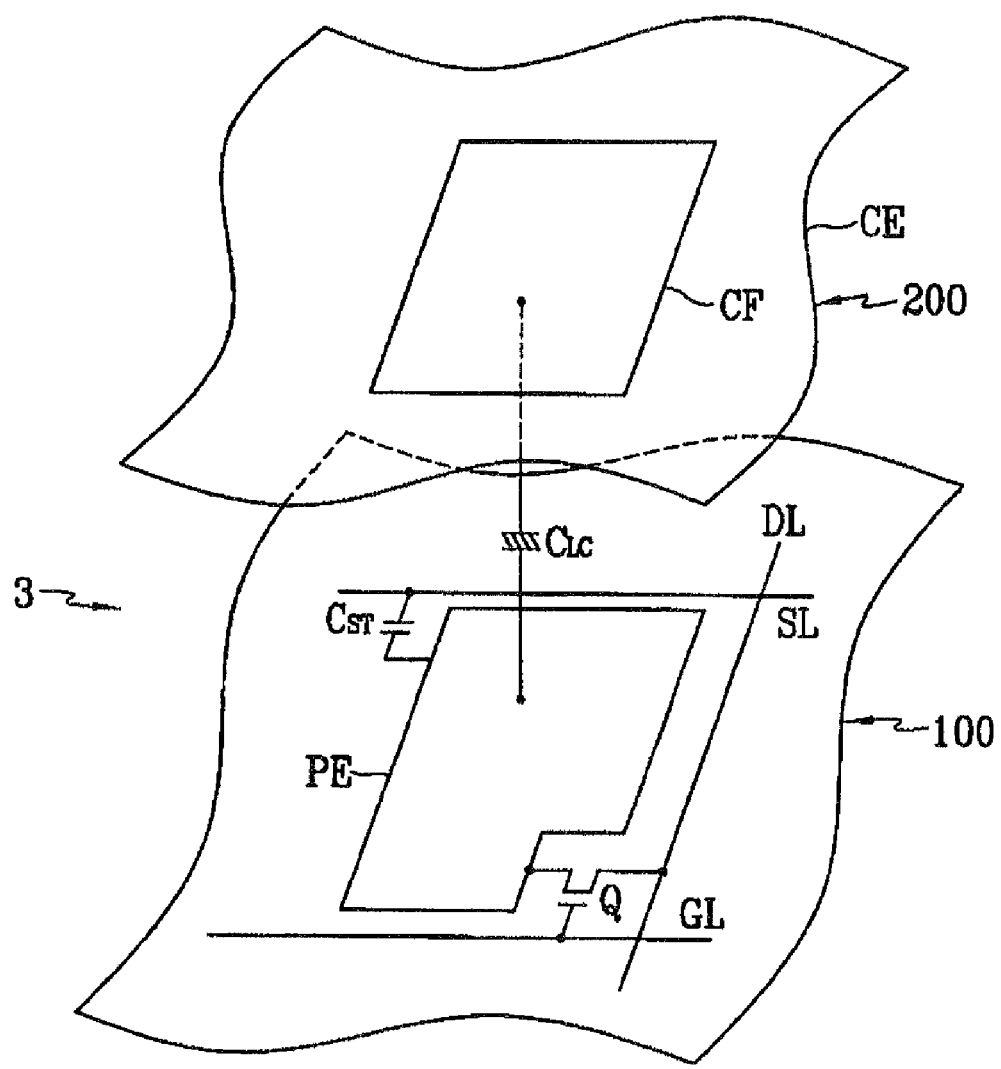
FIG. 3 is an equivalent circuit diagram of a sub-pixel of a pixel the LCD according to various embodiments of the present invention.

FIGS. 1A, 1B, and 1C each is a block diagram of an LCD according to one of three variations of a first embodiment of the present invention. FIG. 2 is an equivalent circuit diagram of a pixel of an LCD in any of the first embodiments of the present invention shown in FIGS. 1A, 1B, and 1C. FIG. 3 is an equivalent circuit diagram of one sub-pixel of a pixel in an LCD according to any of the first embodiments shown in FIGS. 1A, 1B, and 1C of the present invention.

As shown in FIGS. 1A, 1B, and 1C, an LCD according to the first embodiments of the present invention includes a liquid crystal panel assembly 300, a pair of gate drivers 400a and 400b (FIG. 1A) or a single gate driver 400 (FIG. 1B) connected to the liquid crystal panel assembly 300, a data driver 500 connected to the liquid crystal panel assembly 300, a gray voltage generator 800 connected to the data driver 500, and a signal controller 600 for controlling them.

The liquid crystal panel assembly 300 includes a plurality of display signal lines (gate lines G1a-Gnb, and data lines D1-Dm), and a plurality (array) of pixels PX connected to those display signal lines (connected as shown in detail in FIG. 2) and arranged in the form of a matrix. Structurally, as shown in FIG. 3, the liquid crystal panel assembly 300 includes a first substrate (lower panel) 100 and a second substrate (an upper panel) 200 facing each other, and a liquid crystal layer 3 disposed between the two substrates (panels).

The display signal lines (gate lines G1a-Gnb and data lines D1-Dm) are provided on the first substrate (lower panel) 100. The plurality of gate lines G1a-Gnb transmits gate signals (also called "scanning signals"), and the data lines D1-Dm transmits data signals. The gate lines G1a-Gnb extend in the (horizontal) direction of pixel rows (parallel to each other), and the data lines D1-Dm extend in the (vertical) direction of pixel columns (parallel to each other).

FIG. 2 illustrates an equivalent circuit of one pixel (PX) comprised of an "a" subpixel and a "b" subpixel" each subpixel connected to corresponding display signal lines (gate lines GLa and GLb respectively, and data line DL). The display signal lines further include a storage electrode line SL. The storage electrode line SL extends (horizontally) parallel to the gate lines GLa and GLb.

Each of the pixels PX in the array of pixels includes a pair of sub-pixels PXa and PXb, and each of the sub-pixels PXa and PXb respectively includes a switching element Qa and Qb, a liquid crystal capacitor $C_{LCa}$ and $C_{LCb}$ connected to the switching element Qa and Qb, and a storage capacitor $C_{STa}$ and $C_{STb}$, respectively. Each of the storage capacitors $C_{STa}$ and $C_{STb}$ is respectively connected to the corresponding switching element (Qa and Qb) and both are connected to the storage electrode line SL.

Referring to FIG. 3, the switching element Q (Qa or Qb) of each of the sub-pixels PXa and PXb is formed with a thin film transistor TFT formed on the first substrate (lower panel) 100. The switching element Q (Qa or Qb) is a triode device with a control terminal (called a "Gate") connected to a gate line GL, an input terminal (called a "Source") connected to the data line DL, and an output terminal (called a "Drain"). The drain of the switching element Q (Qa or Qb) is connected to the liquid crystal capacitor $C_{LC}$ and the storage capacitor $C_{ST}$.

As illustrated in FIG. 3, the liquid crystal capacitor $C_{LC}$ has two terminals, comprised of the sub-pixel electrode PE of the first substrate (lower panel) 100 and the common electrode CE of the second substrate (upper panel) 200, and a dielectric comprised of the liquid crystal layer 3 disposed between the two electrodes PE and CE. The sub-pixel electrode PE is connected to the switching element Q, and the common electrode CE may be formed over the entire surface of the second substrate (upper panel) 200 to receive a common voltage Vcom. Alternatively, in contrast with the structure shown in FIG. 3, the common electrode CE may be provided on the first substrate (lower panel) 100, and in such case, either one or both of the two electrodes PE and CE may be formed in the shape of a line or a bar on the first substrate (lower panel) 100 adjacent to the other electrode.

The storage capacitor $C_{ST}$ that is parallel to the liquid crystal capacitor $C_{LC}$ is formed by overlapping the storage electrode line SL provided on the first substrate (lower panel) 100 with the pixel electrode PE while interposing an insulator, and a predetermined voltage such as a common voltage Vcom is applied to the storage electrode line SL. Alternatively, the storage capacitor $C_{ST}$ may be formed by overlapping the sub-pixel electrode PE with the gate line of a pixel of a different row while interposing an insulator.

Each of the respective pixels PX preferably expresses light of one of the primary colors (spatial division) or alternately expresses each of the primary colors in the temporal order (time division) such that the colors output by the pixel array can be perceived as the spatial or temporal sum of the primary colors. The primary colors include red, green, and blue colors.

FIG. 3 shows an example of the spatial division where each pixel has a color filter CF on the second substrate (upper panel) 200 that expresses one of the primary colors. Unlike the structure shown in FIG. 3, the color filter CF may alternatively be formed over or under the sub-pixel electrode PE on the second substrate (lower panel) 100.

As shown in FIGS. 1A, 1B, and 1C, the gate driver(s) (400a and 400b, or 400) is connected to the plurality of gate lines G1a-Gnb to apply gate signals to the gate of the TFT in each subpixel (see FIG. 3). The gate signals are transmitted as binary signals at gate ON and gate OFF voltages (Von and Voff) received from the outside.

As shown in FIG. 1A, the pair of gate drivers 400a and 400b form a complete gate driver (like gate driver 400 as shown in FIGS. 1B and 1C) and are respectively located at the left and right sides of the liquid crystal panel assembly 300, and are connected to the odd-numbered and the even-numbered gate lines G1a-Gnb, respectively. Alternatively, as shown in FIGS. 1B and 1C, one gate driver 400 is located at one side of the liquid crystal panel assembly 300, and is connected to all the gate lines G1a-Gnb. As shown in FIG. 1C, two driving circuits 401 and 402 are built into the gate driver 400, and are connected to the odd-numbered and the even-numbered gate lines G1a-Gnb, respectively.

The gray voltage generator 800 generates two sets of gray voltages (or reference gray voltage sets) related to the two light transmittances of each pixel (one light transmittance for each subpixel). The two different gray voltages are independently supplied to the two sub-pixels forming each one pixel. Each gray voltage set includes gray voltages having a positive value with respect to the common voltage Vcom and gray voltages having a negative value with respect to the common voltage Vcom. Alternatively, only a single (reference) gray voltage set may be generated instead of the two (reference) gray voltage sets.

The single data driver 500 is connected to all the data lines D1-Dm of the liquid crystal panel assembly 300 to select and output one of the selected one of the two gray voltage sets from the gray voltage generator 800, and to apply one gray voltage of the selected gray voltage set to the sub-pixels as a data voltage. However, in the case that the gray voltage generator 800 does not supply all the gray voltages but only supplies the reference gray voltages, the data driver 500 divides the reference gray voltages and generates (outputs) all the gray voltages.

The gate driver 400 (or 400a and 400b) or the data driver 500 is directly mounted on the first substrate (lower panel 100 in the form of one or more driving integrated circuit chips, or is mounted on a flexible printed circuit film (not shown) and attached to the liquid crystal panel assembly 300 in the form of a tape carrier package (TCP). By contrast, the gate driver 400 (or 400a and 400b) or the data driver 500 may be integrated on the first substrate (lower panel) 100.

The signal controller 600 controls the operation of the gate driver 400 and the data driver 500.

The structure of the liquid crystal panel assembly 300 will be now be specifically explained with reference to FIGS. 4 to 8.

Figure 4:
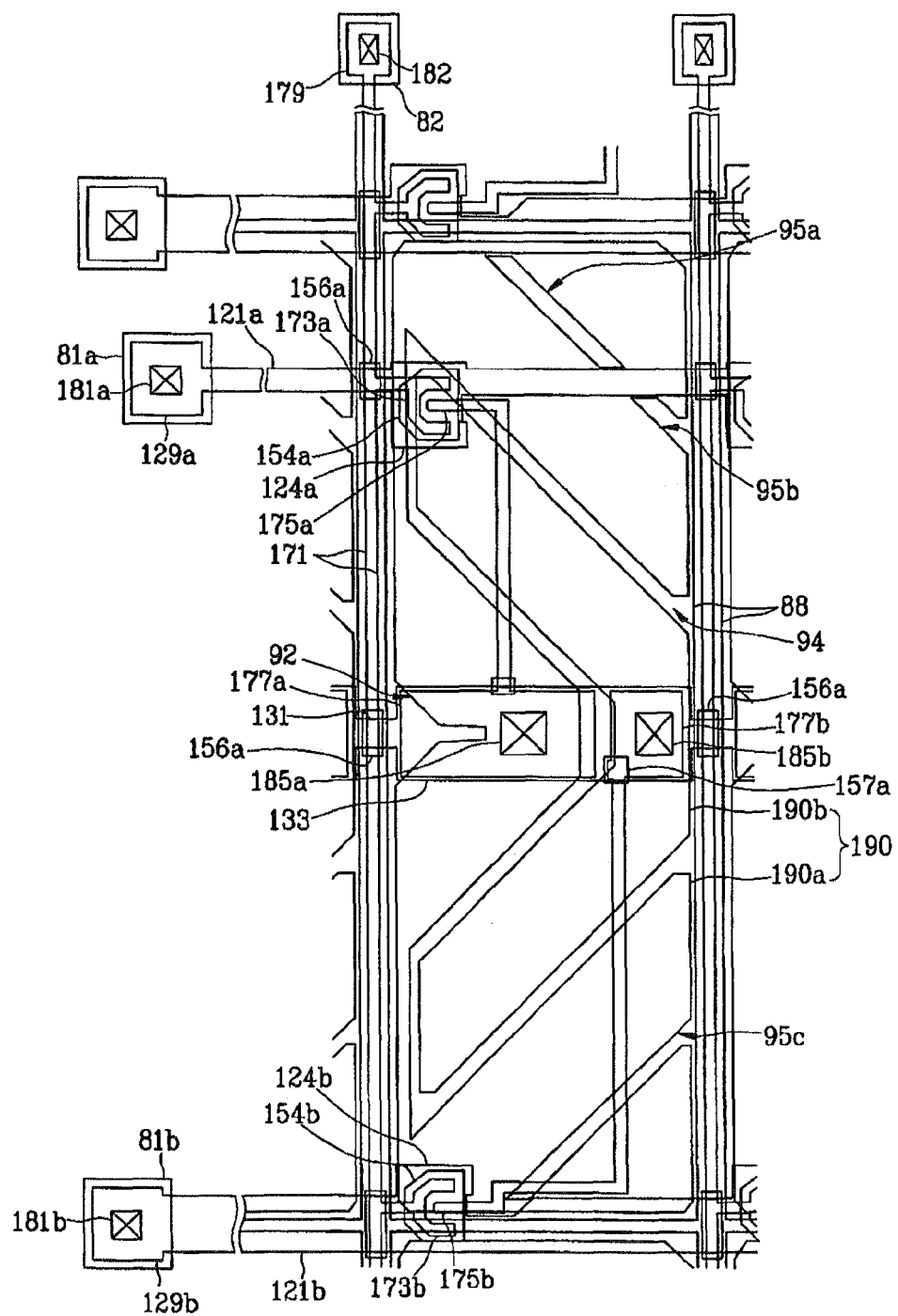
FIG. 4 is a plan view of a lower substrate (panel) for an LCD according to the first embodiment of the present invention.
Figure 5:
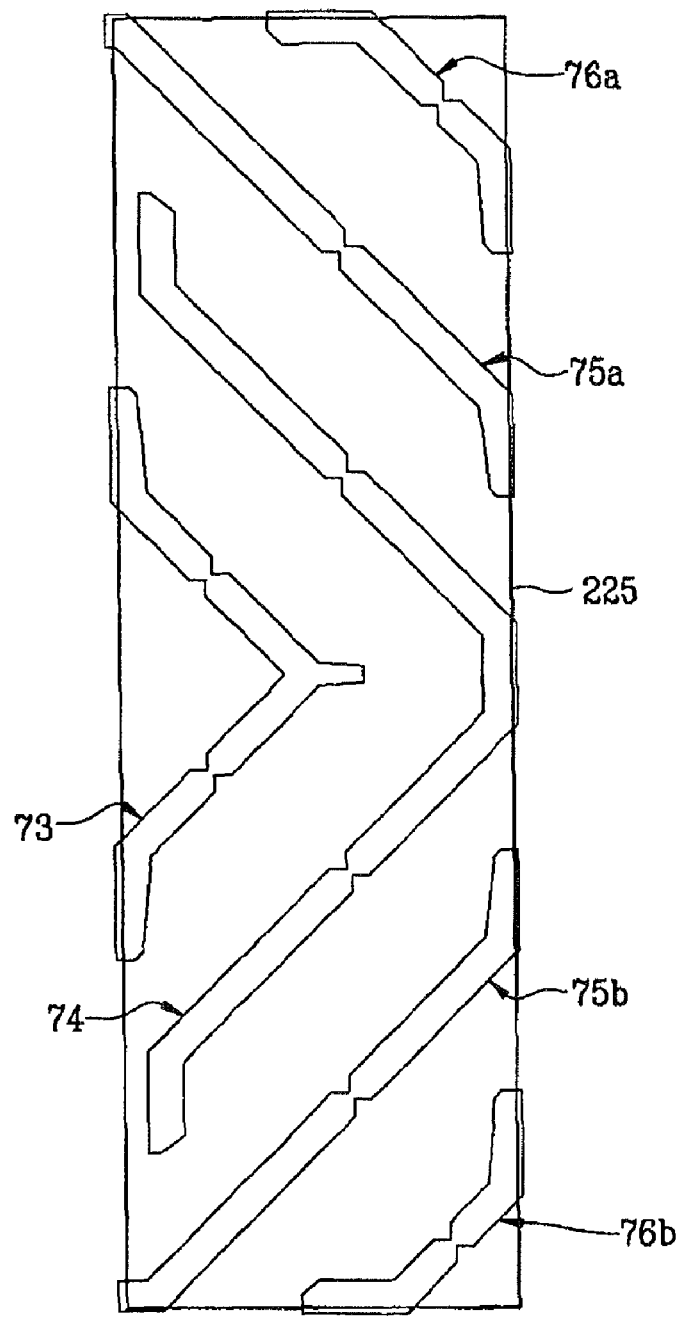
FIG. 5 is a plan view of an upper substrate (panel) of an LCD according to the first embodiment of the present invention.
Figure 6:
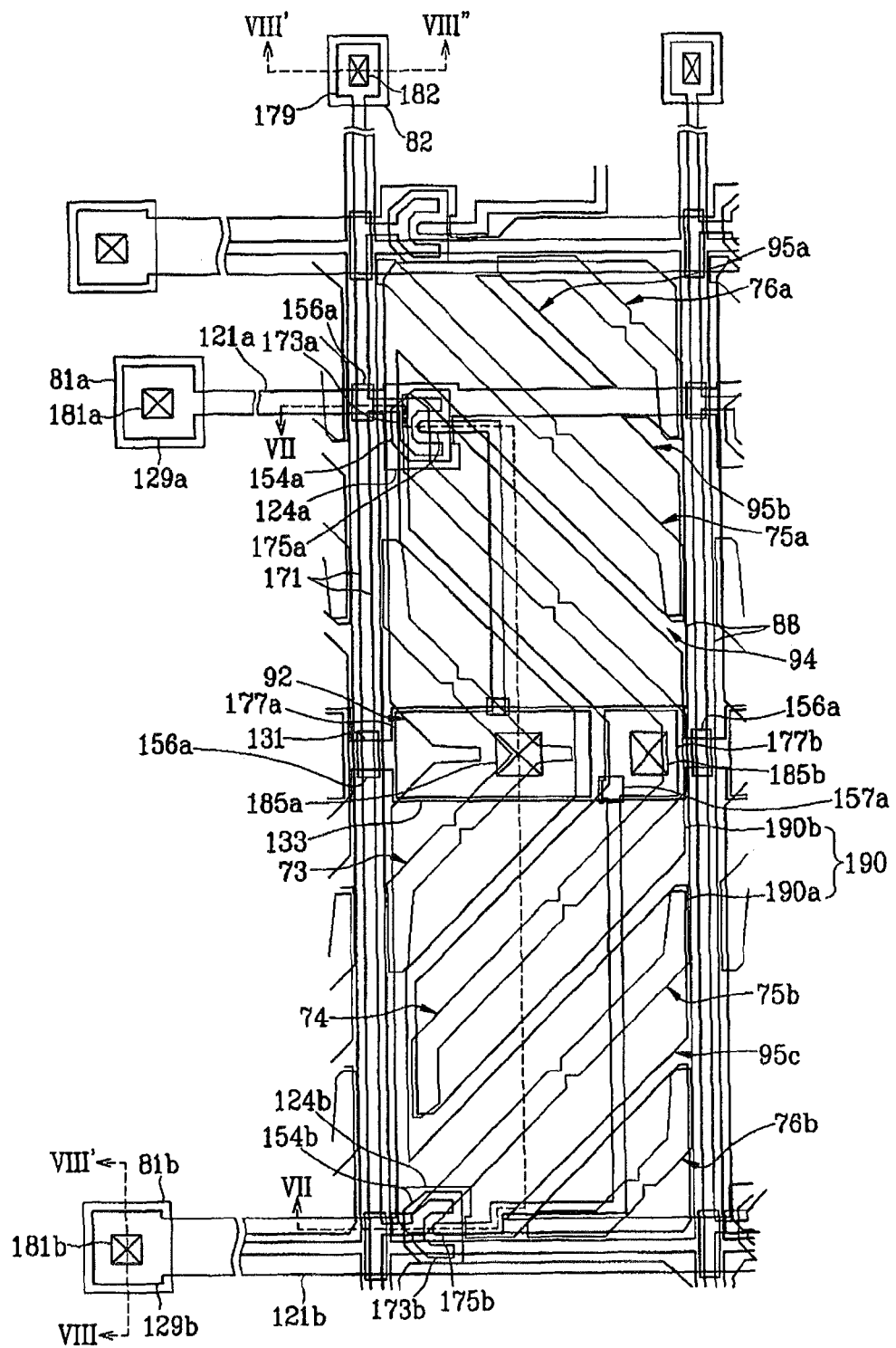
FIG. 6 is a plan view of a liquid crystal panel assembly with the lower substrate (panel) shown in FIG. 4 and the upper substrate (panel) shown in FIG. 5.
Figure 7:
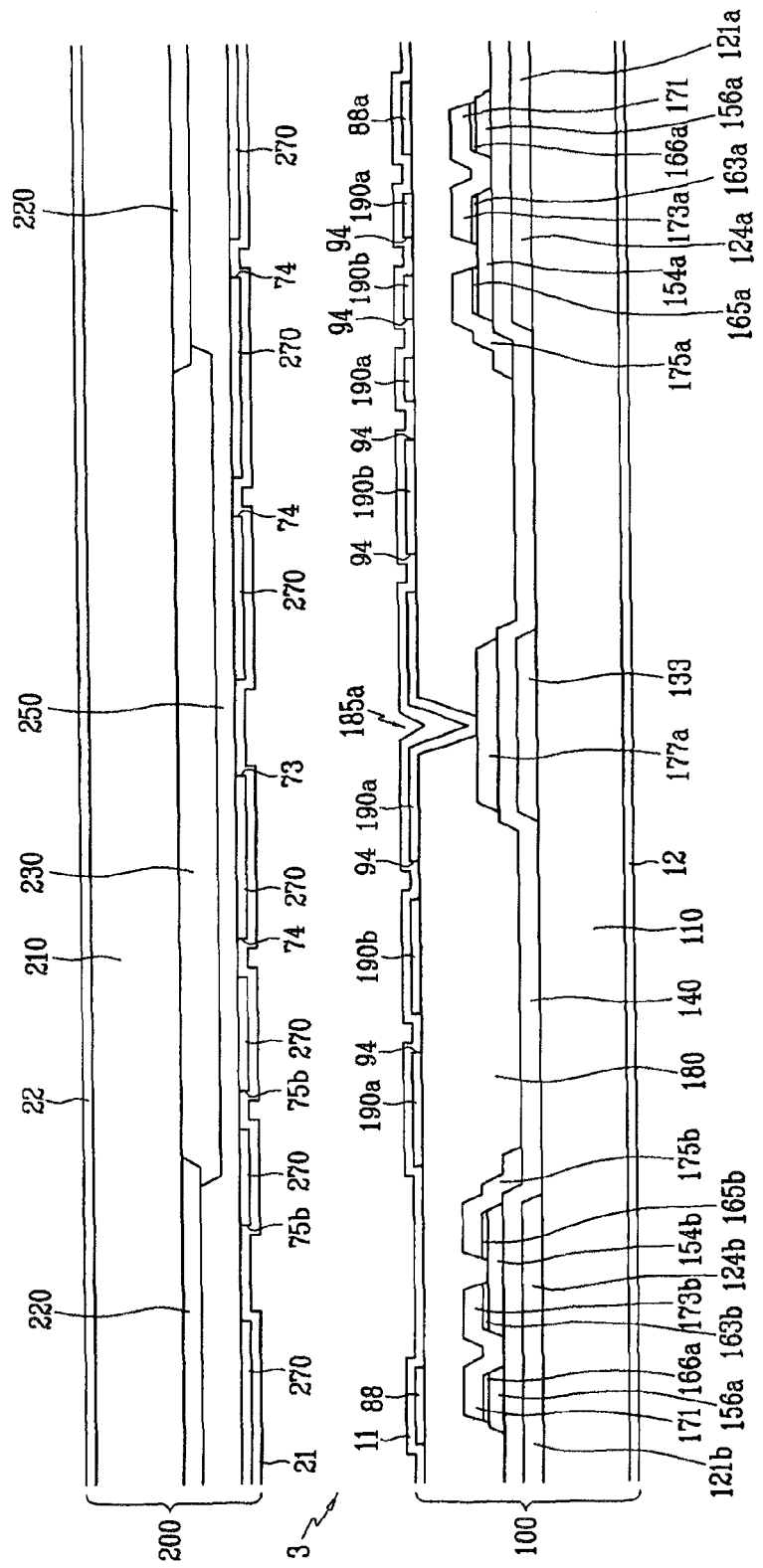
FIGS. 7 and 8 are cross-sectional views of the liquid crystal panel assembly of FIG. 6 taken along section line VII-VII and section line VIII-VIII'-VIII"
Figure 8:
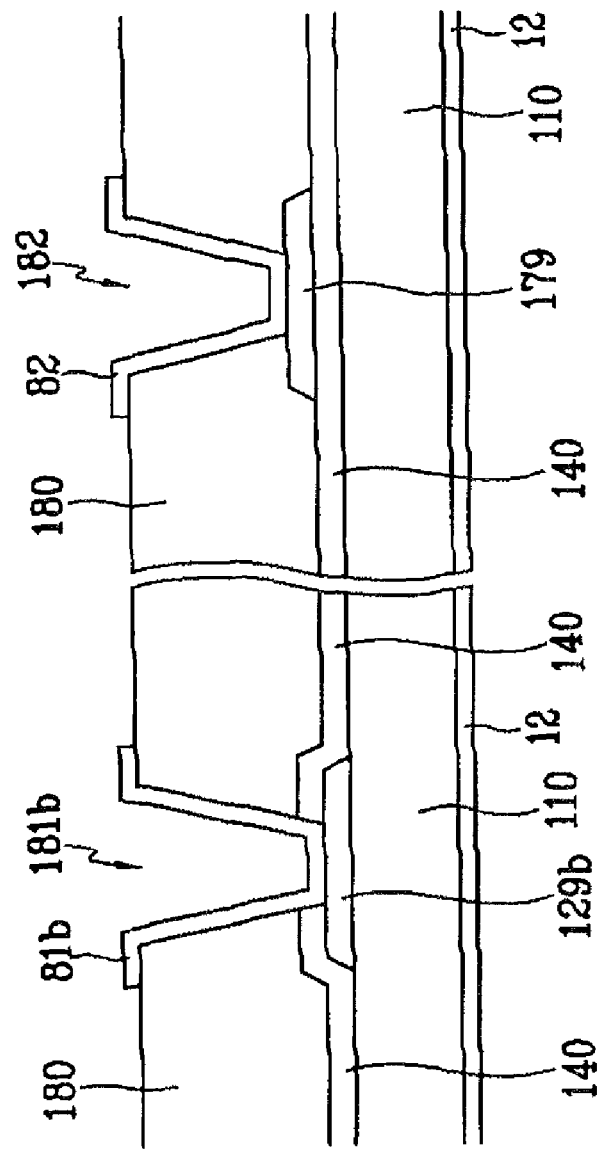

FIG. 4 is a plan view of the first substrate (lower panel) 100 for an LCD according to the first embodiment of the present invention (FIGS. 1A, 1B, 1C), and FIG. 5 is a plan view of the second substrate (an upper panel) 200 for an LCD according to the first embodiment of the present invention. FIG. 6 is a combined plan view of a liquid crystal panel assembly with the first substrate (lower panel) shown in FIG. 4 and the second substrate (upper panel) shown in FIG. 5. FIGS. 7 and 8 are cross-sectional views of the liquid crystal panel assembly of FIG. 6 taken along section line VII-VII and section line VIII-VIII'-VIII", respectively.

As shown in FIGS. 4 to 8, the LCD panel assembly according to the first embodiment includes a lower panel 100, an upper panel 200 facing the lower panel 100, and a liquid crystal layer 3 disposed between those panels.

The lower panel 100 will be specifically explained with reference to FIGS. 4, 6, 7 and 8.

Pairings of first and second gate lines 121a and 121b and a plurality of storage electrode lines 131 are formed on an insulating substrate 110 that may comprise transparent glass or plastic.

The first and second gate lines 121a and 121b extend (horizontally) parallel to each other, and are physically and electrically separated from each other, to transmit gate signals to the gates of TFTs in sub-pixels. The first and second gate lines 121a and 121b are arranged vertically. Each of the gate lines 121a has a plurality of first gate electrodes 124a and each of the gate lines 121b has a plurality of first gate electrodes 124b. The gate electrodes 124a and 124b protrude upward and downward. The first and second gate lines 121a and 121b also have left-side widened-area end portions (terminals) 129a and 129b to be connected to other layers or driving circuits. Alternatively, the end portions (terminals) 129a and 129b may be arranged at the right side of the first and second gate lines 121a and 121b, or at the left and right sides thereof respectively.

The storage electrode line 131 extends horizontally, and may be located closer to the first gate line 121a than to the second gate line 121b. The respective storage electrode lines 131 include a plurality of storage electrodes 133. The storage electrodes 133 are rectangular-shaped to be symmetrical with respect to the storage electrode lines 131. However, the shape and arrangement of the storage electrode lines 131 including the storage electrodes 133 may be altered in various manners. A predetermined voltage is applied to the storage electrode line 131, such as a common voltage applied to a common electrode 270 of the upper panel 200.

The gate lines 121a and 121b and the storage electrode line 131 are formed of an aluminum-based metallic material such as aluminum (Al) and an aluminum alloy, of a silver-based metallic material such as silver (Ag) and a silver alloy, of a copper-based metallic material such as copper (Cu) and a copper alloy, of a molybdenum-based metallic material such as molybdenum (Mo) and a molybdenum alloy, or of chromium (Cr), titanium (Ti), or tantalum (Ta). Alternatively, the gate lines 121a and 121b and the storage electrode line 131 may involve a multi-layered structure formed of two conductive layers (not shown) differentiated in physical properties thereof. One of the conductive layers is formed with a low resistivity metallic material such as an aluminum-based metallic material, a silver-based metallic material, and a copper-based metallic material such that it can reduce the signal delay or voltage drop of the gate lines 121a and 121b and the storage electrode line 131. By contrast, the other conductive layer is formed with a material having an excellent contact (adhesive) characteristic with respect to other materials like indium tin oxide ITO and indium zinc oxide IZO, such as a molybdenum-based metallic material, chromium, titanium, and tantalum. Good examples of such a combination are a structure with a chromium-based under-layer and an aluminum- (alloy) based overlayer, and a structure with an aluminum- (alloy) based under-layer and a molybdenum- (alloy) based overlayer. In addition, the gate lines 121a and 121b and the storage electrode line 131 may be formed with various kinds of other metallic materials and conductors.

The lateral sides of the gate lines 121a and 121b and of the storage electrode line 131 are inclined with respect to the surface of the substrate 110, preferably at 30-80°.

A gate insulating layer 140 is formed of silicon nitride (SiNx) on the gate lines 121a and 121b and the storage electrode line 131.

A plurality of semiconductor islands 154a, 154b, 156a, and 157a are formed on the gate insulating layer 140 of hydrogenated amorphous silicon (abbreviated as a-Si) or of polysilicon. The semiconductor islands 154a and 154b are formed on the gate electrodes 124a and 124b, respectively.

A plurality of ohmic contacts 163a, 163b, 165a, 165b, and 166a are formed, on the semiconductor islands 154a, 154b, and 156a of silicide, or of n+ hydrogenated amorphous silicon wherein n-type impurities such as phosphorous are doped at a high concentration. A pair of the first ohmic contacts 163a and 163b and a pair of the second ohmic contact 165a and 165b are placed on the first and second semiconductor islands 154a and 154b, respectively. The third ohmic contact 166a is placed on the third semiconductor island 156a.

The lateral sides of the semiconductor islands 154a, 154b, 156a, and 157a and the ohmic contacts 163a, 163b, 165a, 165b, and 166a are inclined against the surface of the substrate 110 at 30-80°.

A plurality of data lines 171 and pairs of first and second drain electrodes 175a and 175b are formed on the ohmic contacts 163a, 163b, 165a, 165b, and 166a and the gate insulating layer 140.

The data lines 171 extend vertically such that they cross (over) the gate lines 121a and 121b and (over) the storage electrode line 131 to transmit data voltages to the pixels. The respective data lines 171 include a plurality of first and second source (TFT source) electrodes 173a and 173b extended toward the first and second gate electrodes 124a and 124b, respectively. The respective data lines 171 have end portions (terminals) 179 enlarged in width to facilitate making a connection with other layers or with external devices.

The first and second drain electrodes 175a and 175b are separated from the data lines 171, and face the source electrodes 173a and 173b around the gate electrodes 124a and 124b, respectively. The first and second drain electrodes 175a and 175b have bar-shaped end portions (terminals) placed on the semiconductor islands 154a and 154b, and have extensions 177a and 177b extended from the bar-shaped end portions and overlapped with the storage electrode 133 with a wide area. The bar-shaped end portions of the first and second drain electrodes 175a and 175b are partially surrounded by the U-shaped source electrodes 173a and 173b. The area of the extension 177b of the second drain electrode 175b is smaller than the area of the extension 177a of the first drain electrode 175a.

The first and second thin film transistors Qa and Qb are comprised of the semiconductor islands 154a and 154b together with the first and second gate electrodes 124a and 124b, the first and second source electrodes 173a and 173b, and the first and second drain electrodes 175a and 175b. The channels of the thin film transistors Qa and Qb are formed in the semiconductor islands 154a and 154b between the first and second source electrodes 173a and 173b and the first and second drain electrodes 175a and 175b, respectively.

The data lines 171 and the drain electrodes 175a and 175b are preferably formed with a refractory metal such as molybdenum, chromium, tantalum, and titanium or an alloy thereof, or may comprise a multi-layered structure with a refractory metallic layer (not shown) and a low resistance conductive layer (not shown). Examples of the multi-layered structure are a double-layered structure with a chromium- or molybdenum- (alloy) based under-layer and an aluminum- (alloy) based overlayer, and a triple-layered structure with a molybdenum- (alloy) based underlayer, an aluminum- (alloy) based middle layer and a molybdenum- (alloy) based overlayer. In addition, the data lines 171 and the drain electrodes 175a and 175b may be formed of various other materials or conductors.

The drain electrodes 175a and 175b are inclined at 30-80° (like the gate lines 121a and 121b and the storage electrode lines 131, the lateral sides of the data lines 171).

The ohmic contacts 163a, 163b, 165a, 165b, and 166a are located only between the underlying semiconductor islands 154a, 154b, 156a, and 157a and the overlying data line 171 and drain electrodes 175a and 175b, to lower the contact resistance. The semiconductor islands 154a and 154b have portions exposed through the source electrodes 173a and 173b and the drain electrodes 175a and 175b. The semiconductor islands 156a and 157a make the surface profile of the gate lines 121a and 121b and the storage electrode line 131 smooth, thereby preventing the data line 171 and the drain electrodes 175a and 175b from being cut.

A passivation layer 180 is formed on the data line 171, the drain electrodes 175a and 175b, and the exposed portions of the semiconductor islands 154a and 154b. The passivation layer 180 is formed of an inorganic insulating material such as silicon nitride and silicon oxide, an organic insulating material, or a low dielectric insulating material. The organic insulating material and the low dielectric insulating material preferably have a dielectric constant of 4.0 or less, and examples of the low dielectric insulating material are a-Si:C:O and a-Si:O:F formed through plasma enhanced chemical vapor deposition (PECVD). The passivation layer 180 may be formed with an organic insulating material having photosensitivity, and the surface of the passivation layer 180 may be flattened. Alternatively, the passivation layer 180 may have a double-layered structure with an inorganic underlayer and an organic overlayer such that it bears the excellent insulating characteristic of the organic layer and does not harm the exposed portions of the semiconductor islands 154a and 154b.

A plurality of contact holes 182, 185a, and 185b are formed through the passivation layer 180 so as to expose the end portions 179 of the data line 171 and the extensions 177a and 177b of the drain electrodes 175a and 175b, respectively. A plurality of contact holes 181a and 181b are formed through the passivation layer 180 and the gate insulating layer 140 so as to expose the end portions 129a and 129b of the gate lines 121a and 121b.

A plurality of pixel electrodes 190 (comprised of first and second sub-pixel electrodes 190a and 190b), shielding electrodes 88, and a plurality of contact assistants 81a, 81b, and 82 are formed on the passivation layer 180 with a transparent conductive material such as ITO and IZO, or a reflective metallic material such as aluminum, silver, and alloys thereof.

The first and second sub-pixel electrodes 190a and 190b are physically and electrically connected to the first and second drain electrodes 175a and 175b through the contact holes 185a and 185b to receive data voltages from the first and second drain electrodes 175a and 175b. Different predetermined voltages are applied to the sub-pixel electrode pairs 190a and 190b with respect to one input image signal (one image data corresponding to the luminance of one color), and the magnitudes thereof are determined depending upon the sizes and shape of the sub-pixel electrodes 190a and 190b. Furthermore, the areas of the sub-pixel electrodes 190a and 190b may differ from each other. For instance, the second sub-pixel electrode 190b may receives a voltage higher than that of the first sub-pixel electrode 190a, while it is smaller in area than the first sub-pixel electrode 190a.

Upon receipt of the data voltages, the sub-pixel electrodes 190a and 190b together with the common electrode 270 generate electric fields, and the electric fields align the liquid crystal molecules of the liquid crystal layer 3 between the two electrodes 190 (190a and 190b) and 270.

As explained earlier, the sub-pixel electrodes 190a and 190b and the common electrode 270 (the liquid crystal molecules of the dielectric liquid crystal layer 3) form liquid crystal capacitors $C_{LCa}$ and $C_{LCb}$ to sustain the voltages applied thereto even after the thin film transistors Qa and Qb are turned OFF. Storage capacitors $C_{STa}$ and $C_{STb}$ are arranged parallel to the liquid crystal capacitors $C_{LCa}$ and $C_{LCb}$ to reinforce the voltage storage capacity (to maintain the electric field even after the thin film transistors Qa and Qb are turned OFF). The storage capacitors $C_{STa}$ and $C_{STb}$ are formed by overlapping the first and second sub-pixel electrodes 190a and 190b over the extensions 177a and 177b of the drain electrodes 175a and 175b connected thereto with the storage electrodes 133.

As the first sub-pixel electrode 190a is larger in area than the second sub-pixel electrode 190b, the capacitance of the first liquid crystal capacitor $C_{LCa}$ is greater than that of the second liquid crystal capacitor $C_{LCb}$. As the extension 177a of the first drain electrode 175a overlapping the storage electrode 133 is larger in area than the extension 177b of the second drain electrode 175b, the capacitance of the first storage capacitor $C_{STa}$ is greater than the capacitance of the second storage capacitor $C_{STb}$. Accordingly, the current driving ability of the first thin film transistor Qa should be greater than that of the second thin film transistor Qb, and the W/L value of the first thin film transistor Qa where W is the channel width and L is the channel length is correspondingly higher than the W/L value of the second thin film transistor Qb.

The four corners of the respective pixel electrodes 190 are edge-cut at, and the cut leg is angled against the gate lines 121a and 121b at 45°.

A pair of the first and second sub-pixel electrodes 190a and 190b (forming one pixel electrode 190) are intermixed with each other while separated by a gap 94, and the whole pixel electrode 190 is outlined roughly having a rectangular shape. The second sub-pixel electrode 190b is shaped as an equilateral trapezoid having a trapezoid-hollowed base. The second sub-pixel electrode 190b is mostly surrounded by the first sub-pixel electrode 190a. The first sub-pixel electrode 190a is formed with an upper trapezoid, a lower trapezoid, and a middle trapezoid connected to each other at the left side thereof. The first sub-pixel electrode 190a has cutouts 95a, 95b, and 95c extended from the top side of the upper trapezoid and the bottom side of the lower trapezoid to the right side thereof. The gate line 121a proceeds between the cutouts 95a and 95b. The middle trapezoid of the first sub-pixel electrode 190a is fitted into the hollowed base of the second sub-pixel electrode 190b. The first sub-pixel electrode 190a has a cutout 92 extended along the storage electrode line 131, and the cutout 92 has an entrance at the left side of the first sub-pixel electrode 190a and a horizontal portion horizontally extended from the entrance. The entrance of the cutout 92 has a pair of legs angled against the storage electrode line 131 at 45°. The gap 94 between the first and second sub-pixel electrodes 190a and 190b has two pairs of upper and lower inclined portions angled against the gate lines 121a and 121b at 45° with a substantially even width, and three vertical portions with a substantially even width. For explanatory convenience, the gap 94 will be also referred to as a cutout. The cutouts 92, 94, 95a, 95b, and 95c are inversion-symmetrical to the storage electrode line 131, and are angled against the gate lines 121a and 121b at 45° while extending vertical to each other. The pixel electrode 190 is partitioned into a plurality of domains due to the cutouts 92, 94, 95a, 95b, and 95c.

Accordingly, the pixel electrode 190 is horizontally bisected around the storage electrode line 131, and the upper half and the lower half of the pixel electrode 190 are divided into four domains by way of the cutouts 92, 94 and 95a-95c, respectively. The number of divided domains or cutouts varies depending upon the design factors such as a pixel size, the length ratio of the horizontal to the vertical sides of the pixel electrode 190, and the kind or characteristics of the liquid crystal layer 3.

The first sub-pixel electrode 190a is overlapped by the first and second gate lines 121a and 121b, and the second sub-pixel electrode 190b is overlapped by the first gate line 121a. The first gate line 121a proceeds at the center of the upper half of the pixel electrode 190.

The shielding electrode 88 (88a) has a vertical portion proceeding along the data line 171, and a horizontal portion proceeding along the second gate line 121b. The vertical portion of the shielding electrode 88 completely covers the data line 171, and the horizontal portion thereof is placed internal to the boundary of the gate line 121b. The shielding electrode 88 is connected to the storage electrode line 131 through contact holes (not shown) through the passivation layer 180 and the gate insulating layer 140, or to a short point (not shown) for relaying the common voltage Vcom from the lower panel 100 to the upper panel 200.

The shielding electrode 88 receives the common voltage Vcom, and shields the electric fields formed between, the data line 171 and the pixel electrode 190 as well as between the data line 171 and the common electrode 270, thereby preventing voltage distortion of the pixel electrode 190 and signal delay of the data voltage transmitted by the data line 171.

Furthermore, the pixel electrode 190 and the shielding electrode 88 should be spaced apart from each other to prevent them from short-circuiting each other. Therefore, the pixel electrode 190 is far enough apart from the data line 171 so that the parasitic capacitance therebetween is reduced. Moreover, as the permittivity of the liquid crystal layer 3 is higher than that of the passivation layer 180, in the absence of the shielding electrode 88, the parasitic capacitance between the data line 171 and the shielding electrode 88 is smaller than that between the data line 171 and the common electrode 270.

Moreover, as the pixel electrode 190 and the shielding electrode 88 are formed on the same layer, the distance therebetween is even, and accordingly the parasitic capacitance therebetween is approximately constant. In order to minimize the reduction in aperture ratio, the distance between the shielding electrode 88 and the pixel electrode 190 is preferably minimized.

However, when necessary, such a shielding electrode 88 may be omitted.

The contact assistants 81a, 81b, and 82 are connected to the end portions (terminals) 129a and 129b of the gate lines 121a and 121b and the end portion (terminal) 179 of the data line 171 through the contact holes 181a, 181b, and 182, respectively. The contact assistants 81a, 81b, and 82 serve to increase the adhesion between the exposed end portions (terminals) 129a and 129b of the gate lines 121a and 121b and the exposed end portion (terminal) 179 of the data line 171 and external devices, and to protect them.

An alignment layer 11 is formed on the pixel electrode 190, the shielding electrode 88, the contact assistants 81a, 81b, and 82, and the passivation layer 180 to align the liquid crystal layer 3. The alignment layer 11 may be a horizontal alignment layer.

The second substrate (upper panel) 200 will now be specifically explained with reference to FIGS. 5 to 8.

A light blocking member 220 provided to prevent leakage of light, called the black matrix, is formed on an insulating substrate 210 made of transparent glass. The light blocking member 220 has a plurality of opening portions with the same shape and location as the pixel electrodes 190. Alternatively, the light blocking member 220 may be formed over a portion corresponding to the data line 171, and over portions corresponding to the thin film transistors Qa and Qb. However, the light blocking member 220 may be formed with various shapes to prevent the leakage of light around the pixel electrode 190 and the thin film transistors Qa and Qb.

A plurality of color filters 230 are formed on the insulating substrate 210. The color filters 230 are mostly placed within the opening portions of (region surrounded by) the light blocking member 220, and they extend vertically and longitudinally along the pixel electrode 190. The color filters 230 may express one of the three primary colors of red, green, and blue.

A transparent overcoat layer 250 is formed over the color filters 230 and over the light blocking member 220 to prevent the color filters 230 from being exposed, and to provides a flat surface.

A common electrode 270 is formed on the overcoat layer 250 with a transparent conductive material such as ITO and IZO.

As shown in FIG. 5, the common electrode 270 has a plurality of sets of cutouts 73, 74, 75a, 75b, 76a, and 76b.

The set of the cutouts 73-76b face one pixel electrode 190, and they include middle cutouts 73 and 74, upper cutouts 75a and 76a, and lower cutouts 75b and 76b. As shown in FIG. 6, the cutouts 73-76b are positioned between the neighboring cutouts 92-95c of the pixel electrode 190 as well as between the peripheral cutouts 95a-95c and the corners of the pixel electrode 190. Furthermore, the respective cutouts 73-76b include at least one inclined portion extended parallel to the cutouts 92-95c of the pixel electrode 190.

The upper and lower cutouts 75a-76b include an inclined portion extended from the right side of the pixel electrode 190 toward the bottom or the top side thereof, and horizontal and vertical portions extended from the respective ends of the inclined portion along the sides of the pixel electrode 190 while being overlapped with those sides and obtuse-angled against the inclined portion.

The first middle cutout 73 has a pair of inclined portions obliquely extended from the storage electrode 133 to the left side of the pixel electrode 190, and vertical end portions extended from the ends of the inclined portions along the left side of the pixel electrode 190 while being overlapped with the left side of the pixel electrode 190 and obtuse-angled against the inclined portions. The second middle cutout 74 includes a vertical portion extended along the right side of the pixel electrode 190 while being overlapped therewith, a pair of inclined portions extended from the respective ends of the vertical portion toward the left side of the pixel electrode 190, and vertical end portions extended from the ends of the inclined portions along the left side of the sub-pixel electrode 190b while being overlapped with the left side and obtuse-angled against the inclined portions.

Triangle-shaped notches are formed at the inclined portions of the cutouts 73-76b. The notches may be formed in the shape of a rectangle, a trapezoid, or a semi-circle, or they may be concave or convex. The notches determine the arrangement of the liquid crystal molecules 3 located at the regional boundary corresponding to the cutouts 73-76b.

The number of the cutouts 73-76b may be varied depending upon the design factors, and the light blocking member 220 may be overlapped with the cutouts 73-76b to prevent the leakage of light around the cutouts 73-76b.

As the same common voltage is applied to the common electrode 270 and the shielding electrode 88, an electric field does not exist between those electrodes. Accordingly, the liquid crystal molecules disposed between the common electrode 270 and the shielding electrode 88 continuously hold the initial vertical alignment state thereof, and the light incident thereto is intercepted.

An alignment layer 21 is formed on the common electrode 270 and the overcoat 250 to align the liquid crystal layer 3. The alignment layer 21 may be a horizontal alignment layer.

Polarizers 12 and 22 are provided on the outer surfaces of the panels 100 and 200, and the light transmission axes of the two polarizer plates 12 and 22 are typically perpendicular to each other. One of the light transmission axes of the two polarizers 12 and 22 (or the light absorption axis thereof) proceeds in the horizontal direction. In the case of a reflection type of LCD, one of the two polarizers 12 and 22 may be omitted.

The liquid crystal layer 3 may have a negative dielectric anisotropy, and the liquid crystal molecules of the liquid crystal layer 3 may be vertically aligned with respect to the surfaces of the two panels with no application of a voltage (absent an electric field).

When a common voltage is applied to the common electrode 270 and a data voltage is applied to the pixel electrode 190, an electric field is generated across the liquid crystal layer 3 between the surfaces of the panels 100 and 200. The cutouts 92-95c and 73-76b of the electrodes 190 and 270 deform the electric field, and create electric field components between to the sides (edges) of the cutouts 92-95c and 73-76b.

Accordingly, the electric field is locally inclined with respect to the direction across and between the surfaces of the panels 100 and 200. Thus the liquid crystal molecules are aligned in response to the deformed electric field(s) such that the directors thereof are along to the deformed electric field. At this time, the electric fields formed around the cutouts 92-95c and 73-76b and the sides of the pixel electrode 190 do not proceed parallel to the directors of the liquid crystal molecules, but are angled against the latter at a predetermined angle. Therefore, the liquid crystal molecules are rotated on the plane between the directors of the liquid crystal molecules and the electric fields in the direction with a short movement distance. Consequently, a set of the cutouts 92-95c and 73-76b and the sides of the pixel electrode 190 partition the portion of the liquid crystal layer 3 placed on the pixel electrode 190 into a plurality of domains where the inclination directions of the liquid crystal molecules differ from each other, and hence the reference viewing angle is enlarged.

At least one of the cutouts 92-95c and 73-76b may be replaced by a protrusion or a hollowed portion, and the shape and arrangement of the cutouts 92-95c and 73-76b may be varied.

The display operation of the LCD according to the first embodiment will now be further explained in detail.

The signal controller 600 receives (from an external graphics controller, not shown) input image (color image data) signals R, G, and B and input control signals for controlling the displaying thereof such as vertical synchronization signals Vsync, horizontal synchronization signals Hsync, main clock signals MCLK, and data enable signals DE. The signal controller 600 suitably processes the image (color image data) signals R, G, and B pursuant to the operation conditions of the liquid crystal panel assembly 300. Based on the input (color image data) image signals R, G, and B and the input control signals, the signal controller 600 generates gate control signals CONT1 and data control signals CONT2. The signal controller 600 transmits the gate control signals CONT1 to the gate driver 400, and the data control signals CONT2 and the processed image signals DAT to the data driver 500.

The gate control signals CONT1 include scanning start signals STV for instructing to start the scanning of the "gate ON" voltage Von, and at least one clock signal for controlling the output of the "gate ON" voltage Von.

The data control signals CONT2 include horizontal synchronization start signals STH for informing of the data transmission to one pixel row, load signals LOAD for applying the relevant data voltages to the data lines D1-Dm, and data clock signals HCLK. The data control signals CONT2 may include reverse signals RVS for inverting the polarity of the data voltage with respect to the common voltage Vcom (referred to hereinafter as reversing "the polarity of the data voltage").

The data driver 500 receives image data DAT for a pair of sub-pixels PXa and Pxb in accordance with the data control signals CONT2 from the signal controller 600, and selects one set of gray voltages from among the two sets of gray voltages from the gray voltage generator 800. The data driver 500 further selects the gray voltages corresponding to the respective image data DAT from the selected set of gray voltages, and suitably converts the image data DAT into data voltages to transmit them to the relevant data lines D1-Dm.

Alternatively, a separate external selecting circuit (not shown) may select one set of gray voltages from the two sets of gray voltages, and transmit them to the data driver 500. Furthermore, the gray voltage generator 800 may provide a reference voltage that varies in value, and the data driver 500 may divide the reference voltage to make gray voltages.

The gate driver 400 applies the "gate ON" voltages Von to the gate lines G1a-Gnb in accordance with the gate control signals CONT1 from the signal controller 600 to turn ON the switching elements Qa and Qb connected to the gate lines G1a-Gnb, and accordingly, the data voltages applied to the data lines D1-Dm are applied to the relevant sub-pixels PXa and PXb via the turned-ON switching elements Qa and Qb.

The difference between the data voltage applied to the sub-pixels PXa and PXb and the common voltage Vcom is represented by the charge voltage of the liquid crystal capacitor $C_{LC}$, that is, by the pixel voltage. The liquid crystal molecules are reoriented depending upon the magnitudes of the pixel voltages, and accordingly the polarization of the light passing through the liquid crystal layer 3 is varied. The polarization variation is represented by the variation in light transmittance by way of the polarizers (not shown) attached to the substrates (panels) 100 and 200.

The two sets of gray voltages explained earlier indicate different gamma curves, and as they are applied to the two sub-pixels PXa and PXb of one pixel PX, the gamma curve of one pixel PX becomes a mixture curve thereof. When the two sets of gray voltages are determined, the mixture gamma curve is established to be closer to the front side reference gamma curve. For instance, the front side mixture gamma curve corresponds to an optimally-determined front side reference gamma curve, and the lateral side mixture gamma curve is established to be closest to the front side reference gamma curve. In this way, the lateral side visibility can be enhanced.

As explained previously, the area of the second sub-pixel electrode 190b receiving a relatively higher voltage may be established to be smaller than that of the first sub-pixel electrode 190a so as to reduce the deformation in the lateral side gamma curve. For example, in the case that the area ratio of the first sub-pixel electrode 190a to the second sub-pixel electrode 190b is about 2:1, the lateral side gamma curve becomes closer to the front side gamma curve so that the lateral side visibility can be enhanced.

With a ½ horizontal period (or ½H, a half period of horizontal synchronization signals Hsync), the data driver 500 and the gate driver 400 repeat the same operation. In this way, the "gate ON" voltages Von are sequentially applied to all the gate lines G1a-Gnb for one frame, row by row, thereby applying the data voltages to all the pixels PX. When one frame is terminated, the next frame starts, and the reverse signals applied to the data driver 500 are controlled such that the polarity of the data voltage applied to the respective pixels PX is opposite to that in the previous frame ("frame inversion"). At this time, the polarities of the data voltages flowing through one data line may be inverted depending upon the characteristic of the reverse signals RVS even within one frame (for instance, a row inversion or a dot inversion), or the polarities of the data voltages simultaneously flowing through neighboring data lines may differ from each other (for instance, a column inversion or a dot inversion).

Meanwhile, as shown in FIG. 3, the kickback voltage Vk as defined in the following Equation 1 is generated by the coupling due to the parasitic capacitance Cgd between the control and the output terminals of the switching element Q when the "gate ON" voltage Von is converted into the "gate OFF" voltage Voff, and lowers the voltage applied to the pixel electrode PE.

$$Vk = \frac{Cgd}{C_{LC} + C_{ST} + Cgd} \Delta Vg \qquad \text{Equation 1}$$

where ΔVg is the difference voltage between the "gate ON" voltage Von and the "gate OFF" voltage Voff.

With the LCD according to the first embodiment of the present invention, the magnitudes of the kickback voltages Vka and Vkb of the first and second sub-pixels PXa and PXb are substantially the same. The capacitance values of the liquid crystal capacitors $C_{LCa}$ and $C_{LCb}$ of the first and second sub-pixels PXa and PXb are determined depending upon the area ratio of the first sub-pixel electrode 190a to the second sub-pixel electrode 190b, and the parasitic capacitances Cgda and Cgdb are also determined depending upon the design factors. Accordingly, the areas of the first and second drain electrodes 175a and 175b that are overlapped with the storage electrode 133 are suitably controlled to produce the capacitance values of the first and second storage capacitors $C_{STa}$ and $C_{STb}$ that are capable of making the magnitudes of the kickback voltages Vka and Vkb the same. In addition, the gate signals applied to the first and second sub-pixels PXa and PXb may be differentiated from each other. For instance, the magnitudes of the "gate ON" voltages Von are differentiated to control the value of ΔVg, thereby making the magnitudes of the kickback voltages Vka and Vkb the same. In this way, the magnitudes of the kickback voltages Vka and Vkb of the first and second sub-pixels PXa and PXb are controlled to be the same, thereby preventing the display screen from flickering.

An LCD according to a second embodiment of the present invention will now be specifically explained with reference to FIGS. 9 and 10.

Figure 9:
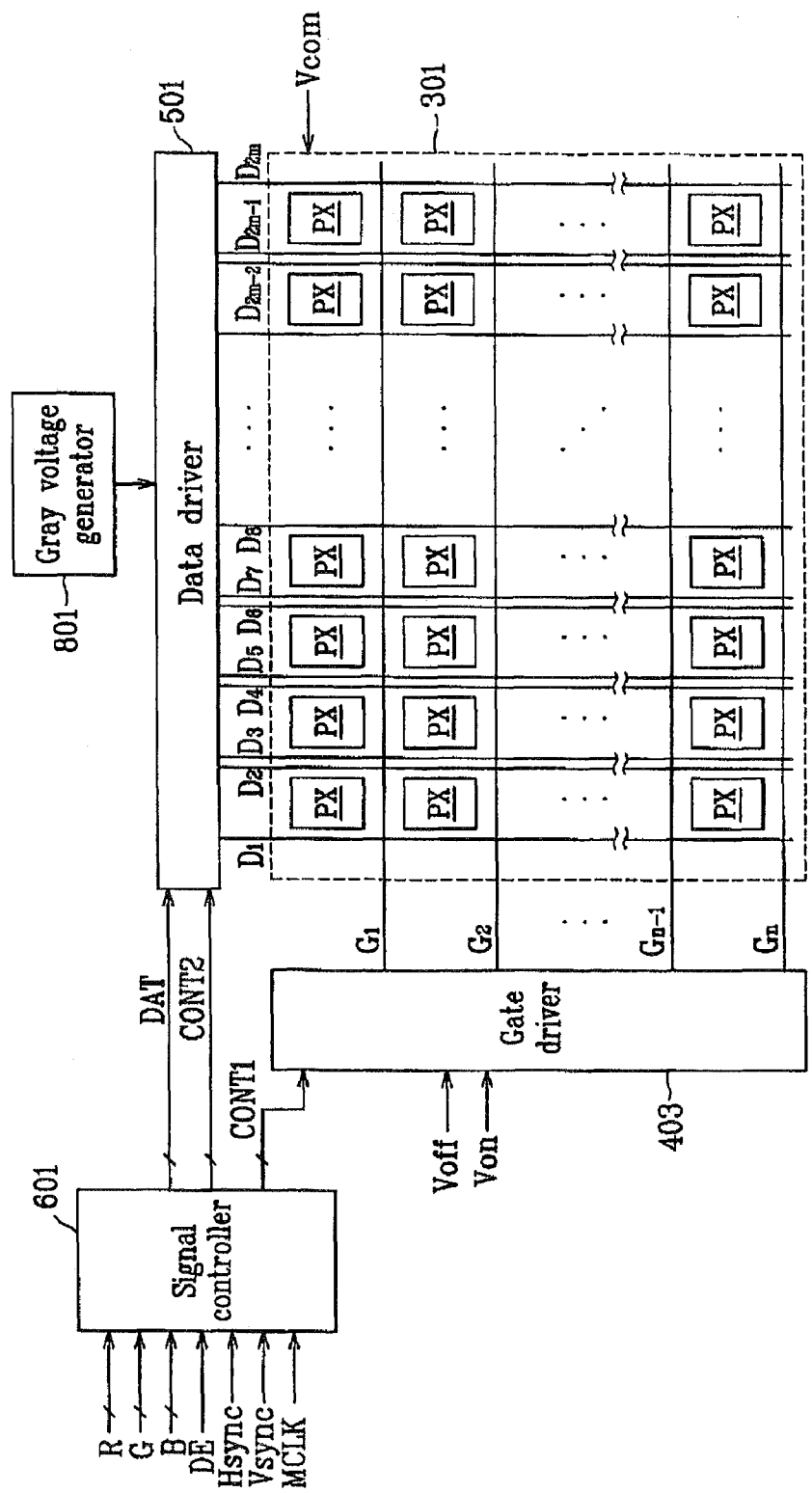
FIG. 9 is a block diagram of an LCD comprising pixels structured according to a second embodiment of the present invention.
Figure 10:
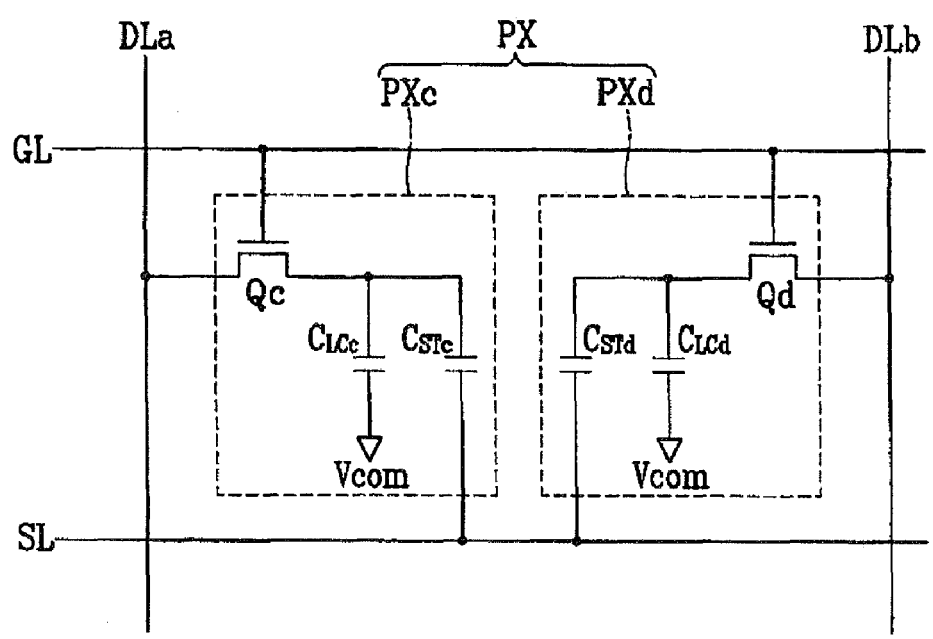
FIG. 10 is an equivalent circuit diagram of a pixel of an LCD according to the second embodiment of the present invention.

FIG. 9 is a block diagram of an LCD according to the second embodiment of the present invention, and FIG. 10 is an equivalent circuit diagram of a pixel (PX) of the LCD of FIG. 9 according to the second embodiment of the present invention.

An LCD according to the second embodiment of the present invention includes a liquid crystal panel assembly 301, a gate driver 403 and a data driver 501 connected to the liquid crystal panel assembly 301, a gray voltage generator 801 connected to the data driver 501, and a signal controller 601 for controlling them.

The liquid crystal panel assembly 301 includes a plurality of display signal lines G1-Gn and D1-D2m, and a plurality (array) of pixels PX connected to those signal lines and arranged in the form of a matrix.

The display signal lines (G1-Gn and D1-D2m) include a plurality of gate lines G1-Gn for transmitting gate signals to the pixels PX, and a plurality of data lines D1-D2m for transmitting data signals to the pixels PX. The gate lines G1-Gn extend (horizontally) in the pixel row direction substantially parallel to each other, and the data lines D1-D2m extend (vertically) in the pixel column direction substantially parallel to each other. The data lines D1-D2m are provided at both sides of each pixel PX in each column. The display signal lines may include storage electrode lines proceeding parallel to the gate lines G1-Gn in addition to the gate lines G1-Gn and the data lines D1-D2m.

FIG. 10 illustrates an equivalent circuit of one pixel PX and the display signal lines connected thereto. The display signal lines connected to each pixel PX include a gate line indicated by GL, data lines indicated by DLa and DLb, and a storage electrode line SL proceeding parallel to the gate line GL.

Each of the respective pixels PX includes a pair of sub-pixels PXc and PXd. The respective sub-pixels PXc and PXd include switching elements Qc and Qd connected to the shared gate line GL and to data lines DLa and DLb, and to liquid crystal capacitors $C_{LCc}$ and $C_{LCd}$ and storage capacitors $C_{STc}$ and $C_{STd}$ connected thereto.

The respective sub-pixels PXc and PXd are substantially the same as those shown in FIG. 3, and hence further explanation thereof would be redundant and is be omitted.

The gray voltage generator 801 generates two sets of gray voltages related to the light transmittance of the sub-pixels PXc and PXd. One set of the two sets of gray voltages has a positive value with respect to the common voltage Vcom, and the other set has a negative value.

The gate driver 403 is connected to the gate lines G1-Gn of the liquid crystal panel assembly 301 to apply gate signals with combinations of the "gate ON" and "gate OFF" voltages Von and Voff from the outside to the gate lines G1-Gn.

The data driver 501 is connected to the data lines D1-D2m of the liquid crystal panel assembly 301 to select the gray voltages from the gray voltage generator 801 and apply them to the sub-pixels PXc and PXd of each pixel PX as data signals.

The signal controller 601 controls the operation of the gate driver 403 and of the data driver 501.

The structure of the liquid crystal panel assembly 301 will now be specifically explained with reference to FIGS. 11 and 12.

Figure 11:
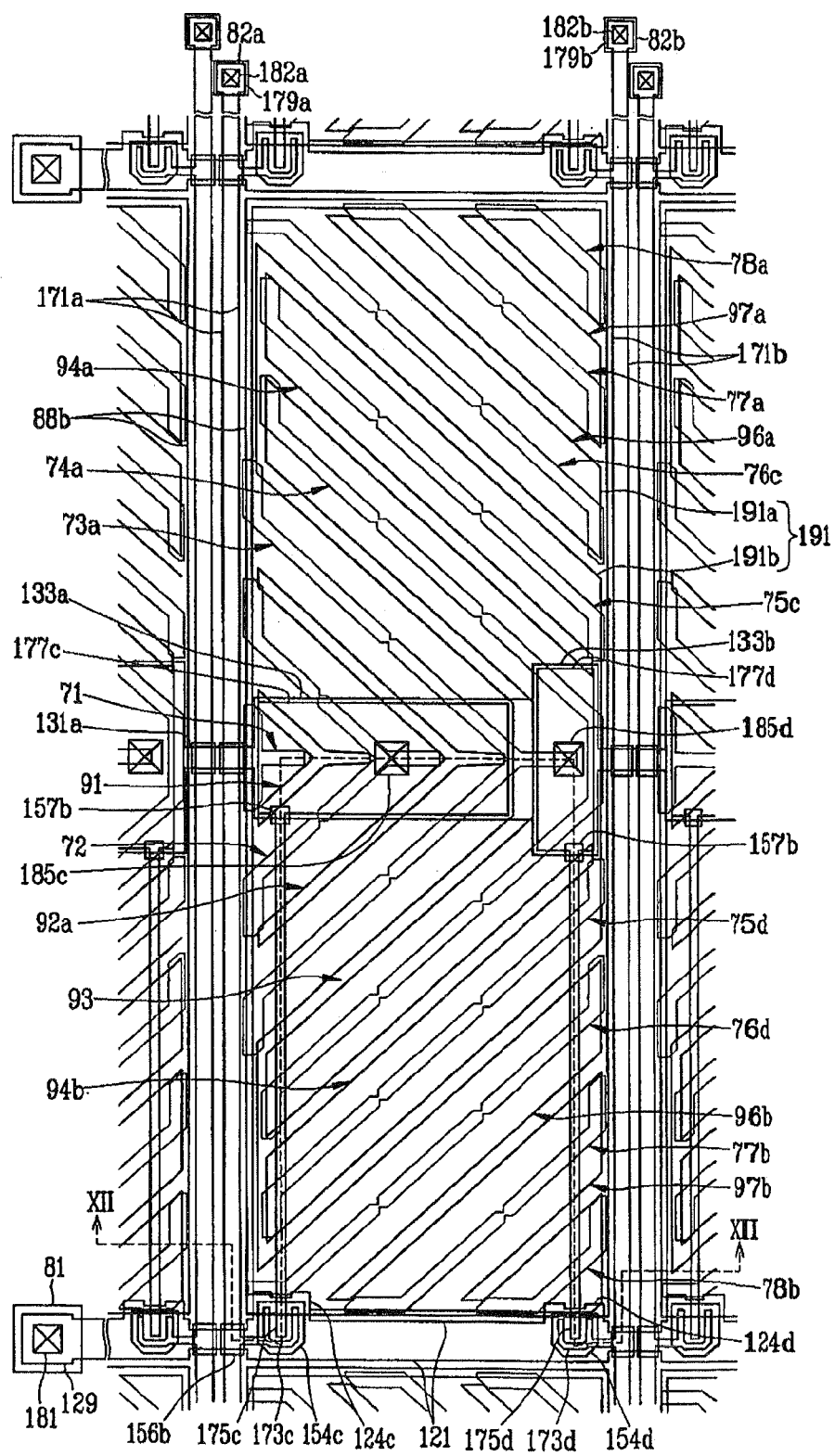
FIG. 11 is a plan view of a liquid crystal panel assembly according to the second embodiment of the present invention.
Figure 12:
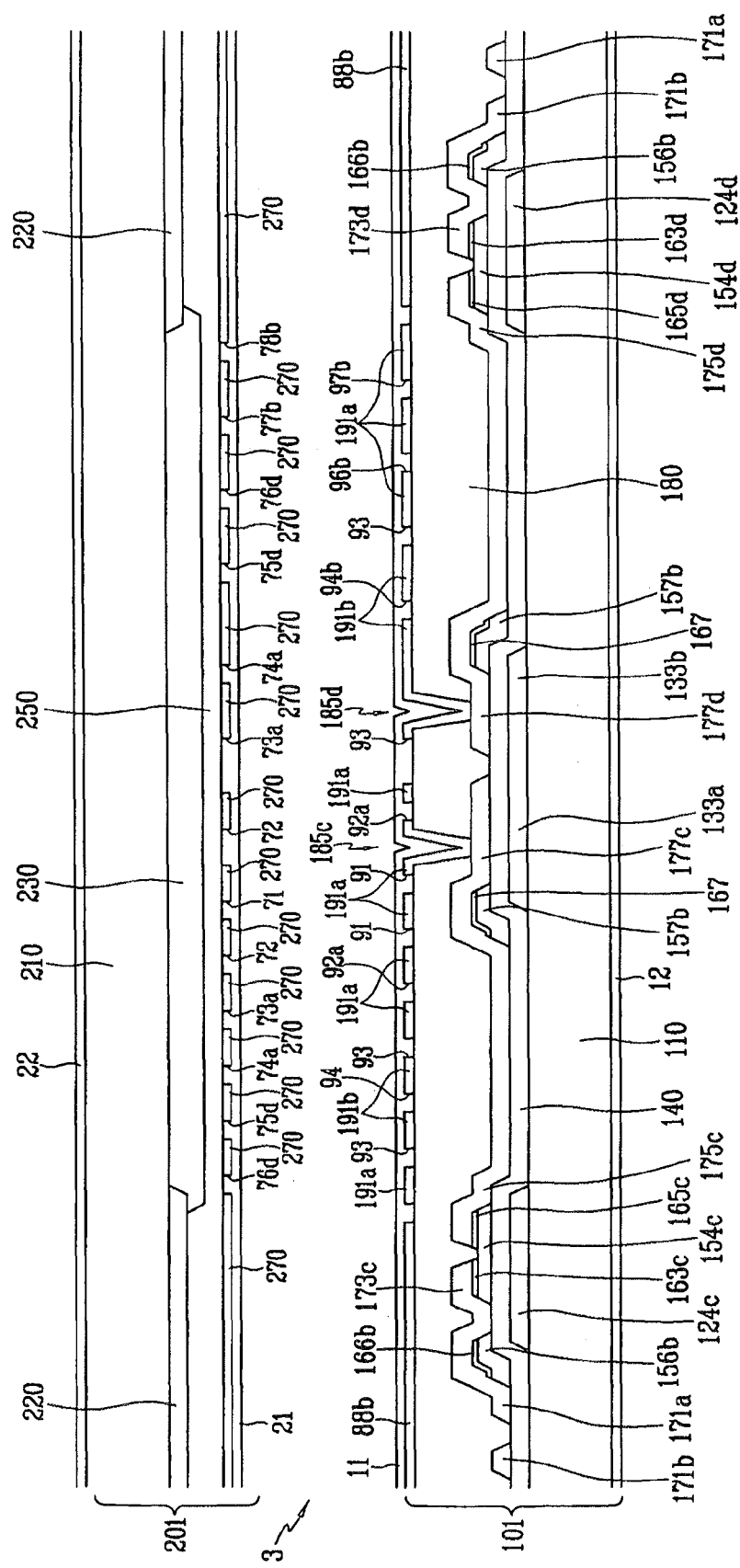
FIG. 12 is a cross-sectional view of the liquid crystal panel assembly of FIG. 11 taken along section line XII-XII line.

FIG. 11 is a plan view of a representative Pixel PX in the liquid crystal panel assembly 301 according to the second embodiment of the present invention (FIG. 9), and FIG. 12 is a cross-sectional view of the pixel PX in the liquid crystal panel assembly 301 of FIG. 11 taken along section line XII-XII.

As shown in FIGS. 11 and 12, the liquid crystal panel assembly 301 includes a first substrate (lower panel 101, a second substrate (upper panel) 201 facing the first substrate (lower panel 101, and a liquid crystal layer 3 disposed between those substrates (panels 101 and 201).

The first substrate (lower panel) 101 will be explained in detail first.

A plurality of gate lines 121 and a plurality of storage electrode lines 131a are formed on an insulating substrate 110 (e.g., made of transparent glass).

The gate lines 121 extend horizontally and are separated from each other, and they transmit gate signals. Each of the gate lines 121 include a plurality of protrusions forming a plurality of gate electrodes 124c and 124d, and a wide end portion 129 for making a connection with other layers or external devices.

Each of the storage electrode lines 131a extends horizontally, and includes a plurality of protrusions forming storage electrodes 133a and 133b. The storage electrodes 133a and 133b are rectangular-shaped symmetrical to the storage electrode line 131a. The area of the first storage electrode 133a is larger than the area of the second storage electrode 133b.

A gate insulating layer 140 is formed of silicon nitride (SiNx) upon the gate line 121 and upon the storage electrode line 131a.

A plurality of semiconductor islands 154c, 154d, 156b, and 157b are formed on the gate insulating layer 140 with hydrogenated amorphous silicon or polycrystalline silicon. The semiconductor islands 154c and 154d are placed over the gate electrodes 124c and 124d, respectively.

A plurality of ohmic contacts 163c, 163d, 165c, 165d, 166b, and 167 are formed on the semiconductor islands 154c, 154d, 156b, and 157b with silicide or n+hydrogenated amorphous silicon doped with n type impurities such as phosphorous at a high concentration. A pair of the first and third ohmic contacts 163c and 165c and a pair of the second and fourth ohmic contacts 163d and 165d are placed on the first and second semiconductor islands 154c and 154d, and the fifth and sixth ohmic contacts 166b and 167 are placed on the third and fourth semiconductor islands 156b and 157b.

A plurality of data lines 171a and 171b and a plurality of drain electrodes 175c and 175d separated from those data lines are formed on the gate insulating layer 140 and the ohmic contacts 163c, 163d, 165c, 165d, 166b, and 167.

The data lines 171a and 171b extend vertically, and cross the gate line 121 and the storage electrode line 131a to transmit data voltages. The data lines 171a and 171b include a plurality of source electrodes 173c and 173d extended toward the gate electrodes 124c and 124d, and end portions 179a and 179b enlarged in width to make a connection with other layers or external devices.

The first and second drain electrodes 175c and 175d are separated from the data lines 171a and 171b, and face the source electrodes 173c and 173d around the gate electrodes 124c and 124d, respectively. The first and second drain electrodes 175c and 175d have bar-shaped end portions placed on the semiconductor islands 154c and 154d, and wide area extensions 177c and 177d extended from the bar-shaped end portions and overlapped with the storage electrodes 133a and 133b, respectively. The bar-shaped end portions are partially surrounded by the U-shaped source electrodes 173c and 173d. The area of the extension 177d of the second drain electrode 175d is smaller than the area of the extension 177c of the first drain electrode 175c.

The first and second thin film transistors Qc and Qd are formed of the first and second gate electrodes 124c and 124d, the first and second source electrodes 173c and 173d, and the first and second drain electrodes 175c and 175d together with the semiconductor islands 154c and 154d. The channels of the thin film transistors Qc and Qd are formed at the semiconductor islands 154c and 154d between the first and second source electrodes 173c and 173d and the first and second drain electrodes 175c and 175d.

The ohmic contacts 163c, 163d, 165c, 165d, 166b, and 167 only exist between the underlying semiconductor islands 154c, 154d, 156b, and 157b and the overlying data lines 171a and 171b and drain electrodes 175c and 175d to lower the contact resistance. The island-shaped semiconductor islands 154c and 154d have portions exposed through the source electrodes 173c and 173d and the drain electrodes 175c and 175d. The semiconductor islands 156b and 157b makes the surface profile of the gate line 121 and the storage electrode line 131a smooth, thereby preventing the data lines 171a and 171b and the drain electrodes 175c and 175d from being cut.

A passivation layer 180 is formed on the data lines 171a and 171b, the drain electrodes 175c and 175d and the exposed portions of the semiconductor islands 154c and 154d.

A plurality of contact holes 185c, 185d, 182a, and 182b are formed at the passivation layer 180 such they expose the extensions 177c and 177d of the drain electrodes 175c and 175d, and the end portions (terminals) 179a and 179b of the data lines 171a and 171b, respectively. A plurality of contact holes 181 are formed at the passivation layer 180 and the gate insulating layer 140 such that they expose the end portions (terminals) 129 of the gate lines 121.

A plurality of pixel electrodes 191 with first and second sub-pixel electrodes 191a and 191b, a plurality of shielding electrodes 88b, and a plurality of contact assistants 81, 82a, and 82b are formed on the passivation layer 180.

The first and second sub-pixel electrodes 191a and 191b are physically and electrically connected to the first and second drain electrodes 175c and 175d through the contact holes 185c and 185d to receive data voltages from the first and second drain electrodes 175c and 175d. Different predetermined data voltages with respect to one input image (data) signal are applied to each pair of the sub-pixel electrodes 191a and 191b, and the magnitudes thereof depend upon the size and shape of the sub-pixel electrodes 191a and 191b. Furthermore, the areas of the sub-pixel electrodes 191a and 191b may differ from each other. For example, the second sub-pixel electrode 191b may receive a voltage higher than that applied to the first sub-pixel electrode 191a, and may be smaller in area than the first sub-pixel electrode 191a.

The sub-pixel electrodes 191a and 191b receiving the data voltages together with the common electrode 270 generate electric fields that determine the arrangement of the liquid crystal molecules of the liquid crystal layer between the two electrodes 191 and 270.

As explained earlier, the respective sub-pixel electrodes 191a and 191b and the common electrode 270 form liquid crystal capacitors $C_{LCc}$ and $C_{LCd}$ to sustain the applied voltage even after the thin film transistors Qc and Qd turn OFF. In order to increase the voltage storage capacity, storage capacitors $C_{STc}$ and $C_{STd}$ are connected in parallel to the liquid crystal capacitors $C_{LCc}$ and $C_{LCd}$ by overlapping the first and second sub-pixel electrodes 191a and 191b and the extensions 177c and 177d of the drain electrodes 175c and 175d connected thereto with the storage electrodes 133a and 133b.

Since the first sub-pixel electrode 191a is larger in area than the second sub-pixel electrode 191b, the first liquid crystal capacitor $C_{LCc}$ has a capacitance greater than the second liquid crystal capacitor $C_{LCd}$. Since the storage electrode 133a and the extension 177c of the first drain electrode 175c overlapped therewith are larger in area than the storage electrode 133b and the extension 177d of the second drain electrode 175d overlapped therewith, the first storage capacitor $C_{STc}$ has a capacitance greater than the second storage capacitor $C_{STd}$. Accordingly, the first thin film transistor Qc may have a current driving capacity greater than that of the second thin film transistor Qd, and hence the value of W/L of the first thin film transistor Qc may be higher than the value of W/L of the second thin film transistor Qd.

A pair of first and second sub-pixel electrodes 191a and 191b forming one pixel electrode 191 engage with each with a gap 93 interposed therebetween, and the outline of the pixel electrode 191 has roughly a rectangular shape. The second sub-pixel electrode 191b is shaped as a rotated equilateral trapezoid having a trapezoid-hollowed base. The second sub-pixel electrode 191b is mostly surrounded by the first sub-pixel electrode 191a. The first sub-pixel electrode 191a is formed with an upper trapezoid, a lower trapezoid, and a middle trapezoid connected to each other at the left side thereof. The middle trapezoid of the first sub-pixel electrode 191a is fitted into the hollowed base of the second sub-pixel electrode 191b. The gap 93 between the first and second sub-pixel electrodes 191a and 191b has two pairs of upper and lower inclined portions angled against the gate line 121 at 45° with a substantially even width, and three vertical portions with a substantially even width. For explanatory convenience, the gap 93 will also be referred to as a cutout.

The first sub-pixel electrode 191a has cutouts 96a, 96b, 97a, and 97b extended from the top side of the upper trapezoid and the bottom side of the lower trapezoid to the right side thereof. The first sub-pixel electrode 191a has cutouts 91 and 92a extended along the storage electrode line 131a, and the cutouts 91 and 92a have a horizontal portion extended from the center in the horizontal direction, and a pair of legs angled against the storage electrode line 131a at 45°. The second sub-pixel electrode 191b has cutouts 94a and 94b extended from the left side thereof toward the right side. The cutouts 91, 92a, 94a, 94b, 96a, 96b, 97a, and 97b are nearly inversion-symmetrical to the storage electrode line 131a, and they proceed vertical to each other while being angled against the gate line 121 at 45°. The upper half and the lower half of the pixel electrode 191 are partitioned into eight domains by way of the cutouts 91-97b, respectively.

The shielding electrode 88b has vertical portions extended along the data lines 171a and 171b, and a horizontal portion extended along the gate line 121. The vertical portions of the shielding electrode 88b completely cover the data lines 171a and 171b, and the horizontal portion thereof also completely covers the gate line 121.

The shielding electrode 88b shields the electric fields formed between the data lines 171a and 171b and the pixel electrode 191 as well as between the data lines 171a and 171b and the common electrode 270, thereby reducing the voltage distortion of the pixel electrode 191 and the signal delay of the data voltage transmitted by the data lines 171a and 171b. In order to prevent the short-circuiting between the pixel electrode 191 and the shielding electrode 88b, they are spaced apart from each other, and hence the pixel electrode 191 is far apart from the data lines 171a and 171b and the gate line 121, thereby reducing the parasitic capacitance therebetween.

The contact assistants 81, 82a, and 82b are connected to the end portion (terminal) 129 of the gate line 121 and the end portions (terminals) 179a and 179b of the data lines 171a and 171b through the contact holes 181, 182a, and 182b, respectively.

An alignment layer 11 is formed on the pixel electrode 191, the contact assistants 81, 82a, and 82b and the passivation layer 180 to align the liquid crystal layer 3.

The second substrate (upper panel) 201 will be now explained in detail with reference to FIGS. 11 and 12.

A light blocking member 220, a plurality of color filters 230, an overcoat layer 250, and a common electrode 270 are sequentially formed on an insulating substrate 210 (e.g., made of transparent glass).

The portion of the common electrode 270 corresponding to (overlapping) one pixel has a set of cutouts 71, 72, 73a, 74a, 75c, 75d, 76c, 76d, 77a, 77b, 78a, and 78b. Thus, the common electrode 270 has a plurality of sets of cutouts 71-78b.

A set of the cutouts 71-78b face one pixel electrode 191, and include middle cutouts 71, 72, 73a, and 74a, upper cutouts 75c, 76c, 77a, and 78a and lower cutouts 75d, 76d, 77b, and 78b. The cutouts 71-78b are arranged at the center of the left side of the pixel electrode 191, between the neighboring cutouts 91-97b of the pixel electrode 191, and between the peripheral cutouts 97a and 97b and the corners of the pixel electrode 191. Furthermore, the respective cutouts 72-78b include at least one inclined portion extended parallel to the cutouts 91-97b of the pixel electrode 191.

The lower and upper cutouts 75c-78b include an inclined portion extended from the right side of the pixel electrode 191 toward the lower or the upper side thereof, and horizontal and vertical portions extended from the respective ends of the inclined portion along the sides of the pixel electrode 190 while being overlapped with those sides and obtuse-angled against the inclined portion.

The first middle cutout 71 has a vertical portion extended along the left side of the pixel electrode 191 while being overlapped therewith, and a horizontal portion extended from the center of the vertical portion along the storage electrode line 131a. The second and third middle cutouts 72 and 73a have a horizontal portion extended along the storage electrode line 131a, a pair of inclined portions extended from the horizontal portion toward the left side of the pixel electrode 191 oblique to the storage electrode line 131a, and vertical end portions extended from the ends of the inclined portions along the left side of the pixel electrode 191 while being overlapped with the left side and obtuse-angled against the inclined portions. The fourth middle cutout 74a has a vertical portion extended along the right side of the pixel electrode 191 while being overlapped therewith, a pair of inclined portions extended from the respective ends of the vertical portion toward the left side of the pixel electrode 191, and vertical end portions extended from the ends of the inclined portions along the left side of the second sub-pixel electrode 191b while being overlapped with the left side and obtuse-angled against the inclined portions.

Triangle-shaped notches are formed at the inclined portions of the cutouts 72-77b. The notches may be formed in the shape of a rectangle, a trapezoid, or a semi-circle, or they may be concave or convex.

An alignment layer 21 is formed on the common electrode 270 and on the overcoat layer 250 to align the liquid crystal layer 3.

Polarizers 12 and 22 are attached to the outer surfaces of the panels 101 and 201.

The display operation of the LCD according to the present embodiment is substantially the same as that related to the previous embodiment, and a further detailed explanation thereof would be redundant and thus will be omitted.

Even with the LCD according to the second embodiment, the magnitudes of the kickback voltages Vkc and Vkd of the first and second sub-pixels PXc and PXd may be adjusted to be substantially the same. The capacitance values of the liquid crystal capacitors $C_{LCc}$ and $C_{LCd}$ of the first and second sub-pixels PXc and PXd are determined depending upon the area ratio of the first sub-pixel electrode 191a to the second sub-pixel electrode 191b, and the parasitic capacitances Cgdc and Cgdd are also determined depending upon the design factors. Accordingly, the areas of the first and second drain electrodes 175a and 175b overlapped with the storage electrodes 133a and 133b are suitably controlled to produce the capacitance values of the first and second storage capacitors $C_{STc}$ and $C_{STd}$ that are capable of making the magnitudes of the kickback voltages Vkc and Vkd the same. In this way, the magnitudes of the kickback voltages Vkc and Vkd of the first and second sub-pixels PXc and PXd are controlled to be the same, thereby preventing the display screen from flickering.

Furthermore, the area of the second sub-pixel electrode 191b that receives a relatively high voltage is established to be smaller than the area of the first sub-pixel electrode 191a, thereby reducing the deformation in the lateral side gamma curve. For example, the area ratio of the first sub-pixel electrode 191a to the second sub-pixel electrode 191b may be established to be about 2:1, thereby enhancing the lateral side visibility.

Many features of the LCD shown in FIGS. 1 to 8 are also features of the LCD shown in FIGS. 9 to 12.

A pixel PX in an LCD according to the third embodiment of the present invention will now be specifically described with reference to FIG. 13.

Figure 13:
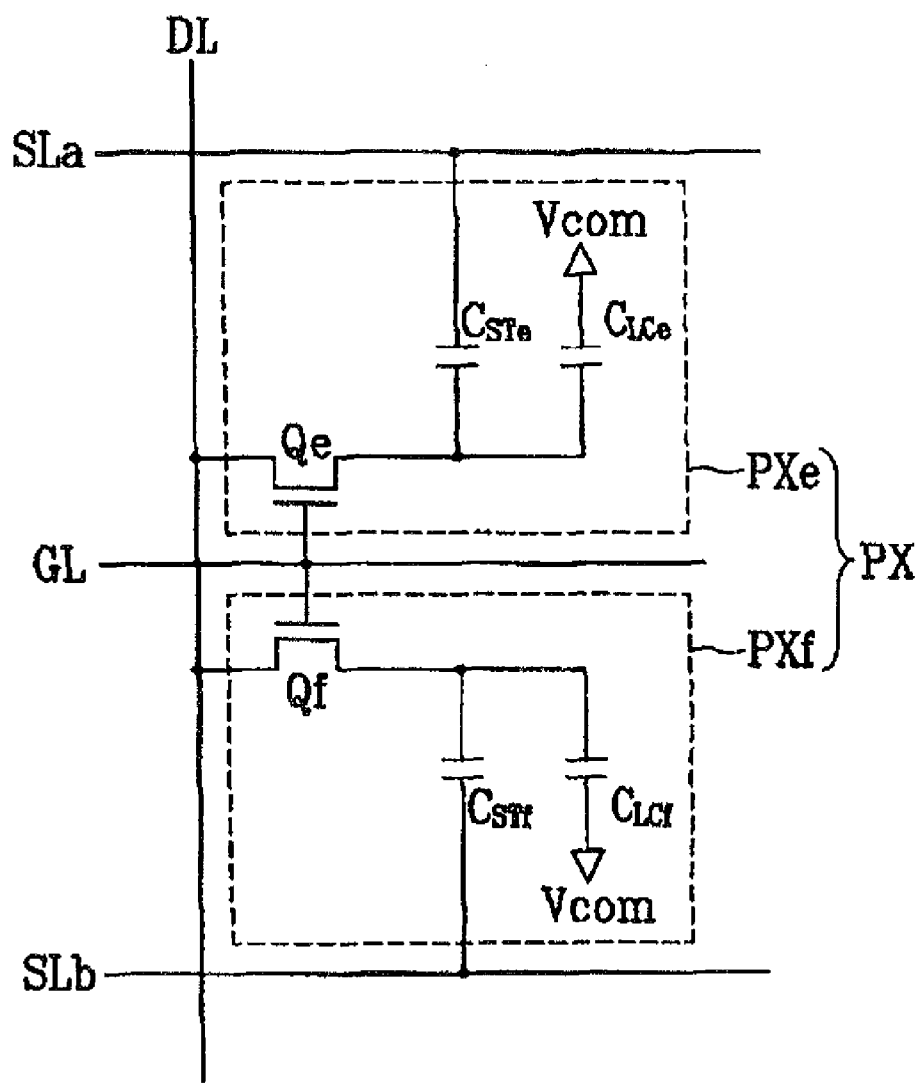
FIG. 13 is an equivalent circuit diagram of a pixel of an LCD according to a third embodiment of the present invention.

FIG. 13 is an equivalent circuit diagram of a pixel PX in a pixel array of an LCD according to a third embodiment of the present invention.

FIG. 13 illustrates display signal lines (GL, DL, Sla, SLb) and an equivalent circuit of two sub-pixels of one pixel PX. The display signal lines include a gate line indicated by GL, a data line indicated by DL, and a pair of first and second storage electrode lines SLa and SLb proceeding substantially parallel to the gate line GL.

The respective pixels PX include a pair of sub-pixels PXe and PXf. The sub-pixels PXe and PXf respectively include switching elements Qe and Of connected to the gate and the data lines GL and DL, liquid crystal capacitors $C_{LCe}$ and $C_{LCf}$ connected to those switching elements, and storage capacitors $C_{STe}$ and $C_{STf}$ connected to the switching elements Qe and Qf and the storage electrode lines SLa and SLb.

The first and second storage electrode lines SLa and SLb receive first and second common voltages Vcom1 and Vcom2. The first and second common voltages Vcom1 and Vcom2 swing between the high voltage and the low voltage with a phase difference of 180°. One data voltage is applied to the respective sub-pixels PXe and PXf enabled by the gate signal, and is charged thereto. The pixel voltages charged at the sub-pixels PXe and PXf are converted into a high voltage and a low voltage (or a low voltage and a high voltage) in accordance with the first and second common voltages Vcom1 and Vcom2 applied to the respective storage electrode lines SLa and SLb, and are differentiated from each other. In this way, different pixel voltages are received by the sub-pixels PXe and PXf, thereby enhancing the lateral side visibility.

In embodiments having the structure according to the third embodiment, the magnitudes of the kickback voltages Vke and Vkf of the first and second sub-pixels PXe and PXf are substantially the same. The capacitance values of the liquid crystal capacitors $C_{LCe}$ and $C_{LCf}$ of the first and second sub-pixels PXe and PXf may be different from each other, and the parasitic capacitances Cgde and Cgdf may also be different from each other depending upon the design factors. Accordingly, the capacitance values of the first and second storage capacitors $C_{STe}$ and $C_{STf}$ may be suitably controlled to make the magnitudes of the kickback voltages Vke and Vkf the same. In this way, the magnitudes of the kickback voltages Vke and Vkf of the first and second sub-pixels PXe and PXf are controlled to be the same, thereby preventing the display screen from flickering.

According to various embodiments of the present invention, one pixel is divided into two sub-pixels, and different data voltages may be separately applied to (or evolved in) the two sub-pixels, thereby enhancing the lateral side visibility. Furthermore, the two sub-pixels may have different area sizes from each other, thereby reducing the deformation in the lateral side gamma curve. For example, the storage capacitances of the two sub-pixels may be designed to make the kickback voltages of each sub-pixel the same, thereby preventing the display image quality from being deteriorated such as by flickering.

While the present invention has been described in detail with reference to the preferred embodiments, those skilled in the art will appreciate that various modifications and substitutions can be made thereto without departing from the spirit and scope of the present invention as set forth in the appended claims.

What is claimed is:

1. A liquid crystal display comprising:
   a plurality of pixels arranged in the form of a matrix, at least one of the pixels having first and second sub-pixels,
   wherein the first sub-pixel includes:
   a first switching element;
   a first liquid crystal capacitor connected to the first switching element; and
   a first storage capacitor connected to the first switching element and the first liquid crystal capacitor,
   wherein the second sub-pixel includes:
   a second switching element;
   a second liquid crystal capacitor connected to the second switching element; and
   a second storage capacitor connected to the second switching element and the second liquid crystal capacitor,
   wherein the first liquid crystal capacitor has greater capacitance than the second liquid crystal capacitor, and
   wherein the first storage capacitor has greater capacitance than the second storage capacitor.

2. The liquid crystal display of claim 1, wherein the liquid crystal capacitor comprises:
   a sub-pixel electrode connected to the switching element;
   a common electrode opposing the pixel electrode with a liquid crystal layer therebetween,
   wherein the first sub-pixel electrode is greater than the second sub-pixel electrode, and the second sub-pixel electrode is applied higher voltage than the first sub-pixel electrode.

3. The liquid crystal display of claim 2, wherein the first switching element is a first thin film transistor and the second switching element is a second thin film transistor, and a channel width to channel length ratio of the first thin film transistor is greater than a channel width to channel length ratio of the second thin film transistor.

4. The liquid crystal display of claim 1, wherein the first switching element is a first thin film transistor and the second switching element is a second thin film transistor, and a channel width to channel length ratio of the first thin film transistor is greater than a channel width to channel length ratio of the second thin film transistor.

5. A liquid crystal display comprising:
a plurality of pixels arranged in the form of a matrix, at least one of the pixels having first and second sub-pixels,
wherein the first sub-pixel includes:
a first thin film transistor comprising a first gate electrode, a first source electrode, and a first drain electrode;
a first sub-pixel electrode connected to the first drain electrode;
a first storage electrode insulated from the first thin film transistor and the first sub-pixel electrode,
wherein the second sub-pixel includes:
a second thin film transistor comprising a second gate electrode, a second source electrode, and a second drain electrode;
a second sub-pixel electrode connected to the second drain electrode;
a second storage electrode insulated from the second thin film transistor and the second sub-pixel electrode,
wherein the first sub-pixel electrode is greater than the second sub-pixel electrode, and
wherein the first drain electrode overlaps the first storage electrode with an insulating layer therebetween, and the second drain electrode overlaps the second storage electrode with the insulating layer therebetween, and
the overlapping area between the first drain electrode and the first storage electrode is larger than the overlapping area between the second drain electrode and the second storage electrode.

6. The liquid crystal display of claim 5, wherein a channel width to channel length ratio of the first thin film transistor is greater than a channel width to channel length ratio of the second thin film transistor.

7. The liquid crystal display of claim 6, wherein the second sub-pixel electrode is applied higher voltage than the first sub-pixel electrode.

8. The liquid crystal display of claim 5, wherein the first and the second gate electrodes are connected to a first gate line.

9. The liquid crystal display of claim 5, wherein the first and the second source electrodes are connected to a first data line.

* * * * *